United States Patent
Riel et al.

(10) Patent No.: US 10,566,363 B2
(45) Date of Patent: Feb. 18, 2020

(54) LIGHT EMITTER AND LIGHT DETECTOR MODULES INCLUDING VERTICAL ALIGNMENT FEATURES

(71) Applicant: Heptagon Micro Optics Pte. Ltd., Singapore (SG)

(72) Inventors: Peter Riel, Bach (CH); Markus Rossi, Jona (CH); Daniel Pérez Calero, Zürich (CH); Matthias Gloor, Boswil (CH); Moshe Doron, San Francisco, CA (US); Dmitry Bakin, San Jose, CA (US); Philippe Bouchilloux, Singapore (SG)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/675,955

(22) Filed: Aug. 14, 2017

(65) Prior Publication Data

US 2017/0343889 A1  Nov. 30, 2017

Related U.S. Application Data

(63) Continuation of application No. 14/903,217, filed as application No. PCT/SG2015/050225 on Jul. 22, 2015, now Pat. No. 9,768,361.
(Continued)

(51) Int. Cl.
*H01L 27/146* (2006.01)
*G02B 7/02* (2006.01)
(Continued)

(52) U.S. Cl.
CPC ........ *H01L 27/14625* (2013.01); *G02B 7/003* (2013.01); *G02B 7/02* (2013.01);
(Continued)

(58) Field of Classification Search
CPC ..... H01L 31/02327; H01L 2224/48091; H01L 2924/00014; H01L 2224/48227;
(Continued)

(56) References Cited

U.S. PATENT DOCUMENTS

| 5,981,945 A | 11/1999 | Spaeth et al. |
|---|---|---|
| 6,838,689 B1 | 1/2005 | Deng et al. |

(Continued)

FOREIGN PATENT DOCUMENTS

| CN | 1761065 A | 4/2006 |
|---|---|---|
| CN | 101042457 A | 9/2007 |

(Continued)

OTHER PUBLICATIONS

Australian Patent Office, International Search Report and Written Opinion, issued by ISA/AU in International Patent Application No. PCT/SG2015/050225 (dated Nov. 2, 2015).
(Continued)

*Primary Examiner* — Bao-Luan Q Le
(74) *Attorney, Agent, or Firm* — Michael Best & Friedrich LLP

(57) ABSTRACT

This disclosure describes various modules that can provide ultra-precise and stable packaging for an optoelectronic device such as a light emitter or light detector. The modules include vertical alignment features that can be machined, as needed, during fabrication of the modules, to establish a precise distance between the optoelectronic device and an optical element or optical assembly disposed over the optoelectronic device.

35 Claims, 21 Drawing Sheets

Related U.S. Application Data

(60) Provisional application No. 62/150,473, filed on Apr. 21, 2015, provisional application No. 62/044,594, filed on Sep. 2, 2014, provisional application No. 62/028,167, filed on Jul. 23, 2014.

(51) Int. Cl.

| | |
|---|---|
| *H01L 33/58* | (2010.01) |
| *H01L 31/0232* | (2014.01) |
| *H01L 33/48* | (2010.01) |
| *G02B 7/00* | (2006.01) |
| *G03B 21/14* | (2006.01) |
| *G03B 21/20* | (2006.01) |

(52) U.S. Cl.
CPC ....... *G03B 21/142* (2013.01); *G03B 21/2033* (2013.01); *H01L 27/1469* (2013.01); *H01L 27/14634* (2013.01); *H01L 31/02325* (2013.01); *H01L 33/483* (2013.01); *H01L 33/58* (2013.01); *H01L 27/14618* (2013.01); *H01L 2933/0033* (2013.01); *H01L 2933/0058* (2013.01)

(58) Field of Classification Search
CPC ....... H01L 2224/49433; H01L 31/0203; H01L 31/02325; H01L 27/14625; H01L 27/14634; H01L 27/1469; G02B 7/04
See application file for complete search history.

(56) References Cited

U.S. PATENT DOCUMENTS

| | | | | |
|---|---|---|---|---|
| 7,153,042 | B2* | 12/2006 | Minamio | H01L 31/0203 385/92 |
| 7,223,619 | B2 | 5/2007 | Wang et al. | |
| 7,264,407 | B2* | 9/2007 | Okamoto | H01L 31/02002 385/14 |
| 8,029,157 | B2 | 10/2011 | Li et al. | |
| 8,246,210 | B2 | 8/2012 | Angelini et al. | |
| 8,308,379 | B2* | 11/2012 | Gooi | G03B 17/12 359/819 |
| 8,541,820 | B2* | 9/2013 | Hayasaki | H01L 21/76898 257/184 |
| 8,637,949 | B2* | 1/2014 | Uekawa | H01L 27/14618 257/434 |
| 8,754,494 | B2* | 6/2014 | Kawasaki | H01L 27/14618 257/431 |
| 8,896,079 | B2* | 11/2014 | Uekawa | H01L 27/14618 257/432 |
| 8,979,316 | B2 | 3/2015 | Lee et al. | |
| 9,001,257 | B1* | 4/2015 | Tang | H04N 1/00249 348/340 |
| 9,525,807 | B2* | 12/2016 | Gooi | G03B 17/12 |
| 9,541,254 | B2* | 1/2017 | Yoon | F21V 13/04 |
| 2004/0184155 | A1 | 9/2004 | Kornblit et al. | |
| 2004/0212055 | A1 | 10/2004 | Exposito et al. | |
| 2004/0264862 | A1 | 12/2004 | Nagano | |
| 2005/0052751 | A1* | 3/2005 | Liu | G02B 3/0012 359/626 |
| 2005/0099532 | A1* | 5/2005 | Tseng | H01L 27/14618 348/374 |
| 2006/0045410 | A1 | 3/2006 | Trott et al. | |
| 2006/0083459 | A1* | 4/2006 | Minamio | H01L 31/0203 385/14 |
| 2006/0180887 | A1* | 8/2006 | Ono | H01L 27/14618 257/432 |
| 2007/0148807 | A1* | 6/2007 | Akram | H01L 27/14618 438/65 |
| 2008/0121921 | A1 | 5/2008 | Loh et al. | |
| 2009/0002853 | A1 | 1/2009 | Yuan | |
| 2010/0025710 | A1* | 2/2010 | Yamada | H01L 27/14618 257/98 |
| 2010/0053407 | A1* | 3/2010 | Crisp | H01L 27/14618 348/311 |
| 2010/0117176 | A1* | 5/2010 | Uekawa | H01L 27/14618 257/432 |
| 2010/0128350 | A1 | 5/2010 | Findlay et al. | |
| 2010/0244171 | A1 | 9/2010 | Nagamatsu et al. | |
| 2010/0327383 | A1* | 12/2010 | Hayasaki | H01L 21/76898 257/432 |
| 2011/0052118 | A1 | 3/2011 | Matsuoka | |
| 2011/0267823 | A1 | 11/2011 | Angelini et al. | |
| 2011/0292271 | A1* | 12/2011 | Lin | G02B 13/0085 348/340 |
| 2012/0019940 | A1 | 1/2012 | Lu et al. | |
| 2012/0068291 | A1* | 3/2012 | Kawasaki | H01L 27/14618 257/432 |
| 2012/0141114 | A1* | 6/2012 | Gooi | G03B 17/12 396/529 |
| 2012/0230670 | A1* | 9/2012 | Hirooka | H01L 27/14618 396/529 |
| 2013/0070147 | A1* | 3/2013 | Gooi | G03B 17/12 348/345 |
| 2013/0070215 | A1 | 3/2013 | Higo | |
| 2014/0041214 | A1* | 2/2014 | Barlow | H05K 3/0052 29/841 |
| 2014/0071689 | A1* | 3/2014 | Yoon | F21V 7/00 362/296.01 |
| 2014/0110807 | A1* | 4/2014 | Uekawa | H01L 27/14618 257/432 |
| 2014/0125849 | A1 | 5/2014 | Heimgartner et al. | |
| 2014/0268787 | A1 | 9/2014 | Nozaki | |
| 2014/0376092 | A1 | 12/2014 | Mor | |
| 2016/0133762 | A1* | 5/2016 | Blasco Claret | G02B 13/0085 257/432 |
| 2016/0134790 | A1* | 5/2016 | Gooi | G03B 17/12 348/373 |

FOREIGN PATENT DOCUMENTS

| | | |
|---|---|---|
| CN | 101853846 | 10/2010 |
| CN | 101853849 A | 10/2010 |
| CN | 102449524 A | 5/2012 |
| JP | H05-259482 A | 10/1993 |
| JP | 2004266340 A | 9/2004 |
| JP | 2005-292242 A | 10/2005 |
| JP | 2008-197282 A | 8/2008 |
| JP | 2010-066742 | 3/2010 |
| JP | 2011-233928 A | 11/2011 |
| JP | 2012-189910 A | 10/2012 |
| KR | 1020080064335 | 7/2008 |
| KR | 2010-066742 | 3/2010 |
| TW | 200516779 A | 5/2005 |
| WO | 2010/052903 | 5/2010 |
| WO | 2010/074743 | 7/2010 |
| WO | 2010/111465 | 9/2010 |
| WO | 2012/022000 | 2/2012 |
| WO | WO 2013/172786 | 11/2013 |

OTHER PUBLICATIONS

Office Action issued in Korean Application No. 10-2016-7000323, dated Dec. 21, 2016, 15 pages (with English translation).

The State Intellectual Property Office of the People's Republic of China, Search Report issued in Chinese Application No. 2015800391690, dated Jun. 4, 2018, 4 pages (with English translation).

* cited by examiner

LIGHT EMITTER AND LIGHT DETECTOR MODULES INCLUDING VERTICAL ALIGNMENT FEATURES

CROSS-REFERENCE TO RELATED APPLICATION(S)

This application is a continuation of U.S. application Ser. No. 14/903,217, filed on Jan. 6, 2016, which is the National Stage of International Application No. PCT/SG2015/050225, filed on Jul. 22, 2015, which claims the benefit of priority U.S. Application No. 62/150,473, filed on Apr. 21, 2015, U.S. Application No. 62/044,594, filed on Sep. 2, 2014 and U.S. Application No. 62/028,167, filed on Jul. 23, 2014. The disclosure of the prior application(s) is incorporated herein by reference.

TECHNICAL FIELD

The present disclosure relates to light emitter and light detector modules.

BACKGROUND

Various consumer electronic products and other devices include a packaged light emitter module designed for precision light projection applications. The spatial dimensions of such modules generally need to be controlled to high precision, such that the optical elements and the light emitting element are precisely positioned, for example, at an optimal distance. Thus, the modules should have very small spatial (dimensional) and optical (e.g., focal length) tolerances for optimal performance. However, the use, for example, of adhesive in the packaged light emitter module, as well as other factors such as the inherent manufacturing tolerances of the pertinent support structure, often expand the tolerances of the module to an unacceptable level. The foregoing issues may be applicable to light detector modules as well.

For some applications, the light emitter module needs to operate at optimal optical performance over a relatively large temperature range (e.g., −20° C. −70° C.), which can raise various problems. First, the spatial dimensions of the optical elements and the support structure may vary with temperature. Second, the refractive index of the optical elements may vary with temperature. This latter variation may induce a variation in focal length, causing poor performance of the light emitter module. Further, the modules often require good heat conduction.

SUMMARY

This disclosure describes various modules that can provide ultra-precise and stable packaging for a light emitting or light detecting optoelectronic device. The modules include vertical alignment features that can be machined, if needed, during fabrication of the modules, to establish a precise distance between the optoelectronic device and an optical element or optical assembly. Other features are described that, in some cases, can help facilitate improved focusing of an optical beam, for example, even over a relatively wide range of temperatures.

In one aspect, for example, a method of fabricating a light emitter or light detector module is described. The method includes providing a housing laterally surrounding an optoelectronic device mounted on a substrate and fixing a first optical element in place over the optoelectronic device using an adhesive. The optoelectronic device can be implemented, for example, as a light emitter or light detector. The optical element is substantially transparent to light emitted or detectable by the optoelectronic device. One or more vertical alignment features separate the optical element from a surface of the housing. The adhesive, however, is not provided at any interface with the vertical alignment feature(s). The method can include performance of several steps prior to fixing the optical element in place over the optoelectronic device. In particular, prior to fixing the optical element in place over the optoelectronic device, one or more measurements can be made that are indicative of a height in a direction of the module's optical axis. Further, at least one surface can be machined, by an amount based on the measurement(s), to achieve a specified distance between the optoelectronic device and the optical element. The machined surface(s) can include at least one of: (i) a contact surface of a particular vertical alignment feature, or (ii) an opposing contact surface, which comes into direct contact with the contact surface of the particular vertical alignment surface when the optical element is fixed in place over the optoelectronic device.

Various arrangements of light emitter and light detector modules that include customized (e.g., machined) vertical alignment features are described as well. For example, a light emitter module or light detector module can include an optoelectronic device mounted on a substrate, the optoelectronic device being operable to emit light or detect light. A housing laterally surrounds the optoelectronic device and serves as sidewalls for the module. An optical element is disposed over the optoelectronic device and is substantially transparent to light emitted or detectable by the optoelectronic device. One or more vertical alignment features separate the optical element from the housing, wherein the optical element is in direct contact with the one or more vertical alignment features.

Various implementations provide one or more of the following advantages. For example, the modules in some cases can provide a precise z-height such that the gap between the optoelectronic device and the optical element is within a few microns of the desired optimal value (e.g., ±5 µm and, in some cases within ±3 µm). In particular, customizable vertical alignment features can be machined during the fabrication process to achieve the desired z-height. Various approaches are described that can help avoid potentially adverse consequences of adhesive on the z-height. Other features, such as incorporating at least one optical element composed of glass and/or an auto-focus mechanism, can further help correct for offsets in the z-height. Additional features (e.g., mounting the optoelectronic device on a copper alloy substrate) also can help ensure that the module functions well over a wide range of temperatures. The techniques and modules described in this disclosure can, therefore, facilitate achieving and maintaining improved focusing of an optical beam.

In accordance with another aspect, an illumination projector module to project a light pattern includes a first assembly including an optoelectronic device operable to emit light and an optical element including a mask. The optoelectronic device is arranged to transmit light through the optical element. The module also includes an optical assembly including one or more optical elements and a first spacer having one or more vertical alignment features that are in direct contact with the optical element that includes the mask. The first spacer also is fixed to a second spacer that forms part of the first assembly and that laterally surrounds the optoelectronic device.

One or more of the following features are included in some implementations. For example, the first spacer can be fixed to the second spacer by adhesive. The optical element that includes the mask can have one or more transparent windows each of which is aligned with a respective alignment mark on the optoelectronic device. Such windows can help facilitate alignment of the optical assembly with the optoelectronic device. The optical element that includes the mask can be fixed to the second spacer by adhesive and can include one or more UV-transparent windows, each of which is disposed over at least part of the adhesive that fixes the first spacer to the second spacer. The UV-transparent windows can facilitate UV-curing of the adhesive during assembly of the module. In some cases, the mask comprises a black chrome mask on a transparent substrate.

Other aspects, features and advantages will be apparent from the following detailed description, the accompanying drawings, and the claims.

DETAILED DESCRIPTION

Figure 1A:
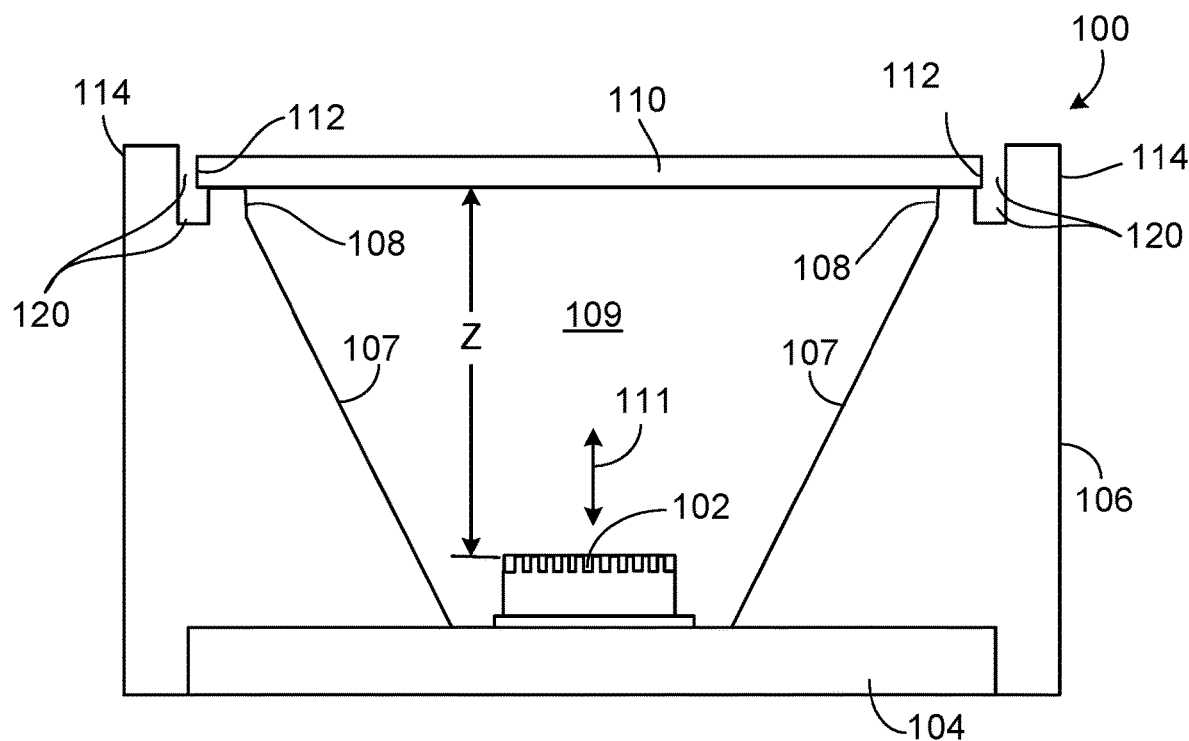
FIGS. 1A-1C are cross-sections of packaged light emitter modules.

As illustrated in FIG. 1A, a packaged light emitter module 100 can provide ultra-precise and stable packaging for a light emitter 102 mounted on a substrate 104 such as a lead frame. The light emitter 102 may be of the type that generates coherent, directional, spectrally defined light emission (e.g., a vertical cavity surface emitting laser (VCSEL) or a laser diode). In some implementations, the light emitter 102 is operable to emit infra-red (IR) light or light in the visible range of the spectrum. As the operational temperature of the light emitter 102 may be relatively high, the lead frame or other substrate 104 can be composed of a material such as a copper alloy exhibiting low thermal expansion. Such materials have relatively high thermal conductivity and, therefore, also can help provide good thermal management for the module. For example, a substrate comprised primarily of copper (whose thermal conductivity is about 260 W/(mK)) can facilitate heat being conducted away from the module rapidly, thereby preventing dimensional changes due to thermal expansion.

A housing 106 that laterally surrounds the light emitter 102 and the lead frame 104 serves as the module's sidewalls. Preferably, the housing 106 also is composed of a material exhibiting low thermal expansion (e.g., injection molded epoxy with a ceramic filler or injection molded metal). In some cases, the inner-facing surface 107 of the housing is slanted at an angle relative to the surface of the substrate 104 and defines a cone- or inverted-pyramid-shaped space 109 within which the light emitter 102 is located. A diffractive or other optical element, which may be (or which may include) a transparent cover 110, is disposed over the light emitter 102 and is supported by one or more vertical alignment features (e.g., studs or spacers) 108 separating the main body of the housing 106 from the cover 110. In some cases the cover 110 may be composed of glass or another transparent inorganic material such as sapphire. An advantage of using such materials is that they have a relatively low coefficient of thermal expansion compared to the lens material. To prevent or reduce light leakage from the module, the side edges 112 of the cover 110 can be shielded by non-transparent walls 114 that laterally surround the cover 110. The walls 114 can be formed, for example, by injection molding and can be formed as a unitary piece with (and can be composed of the same material as) the body of the housing 106.

Figure 1B:
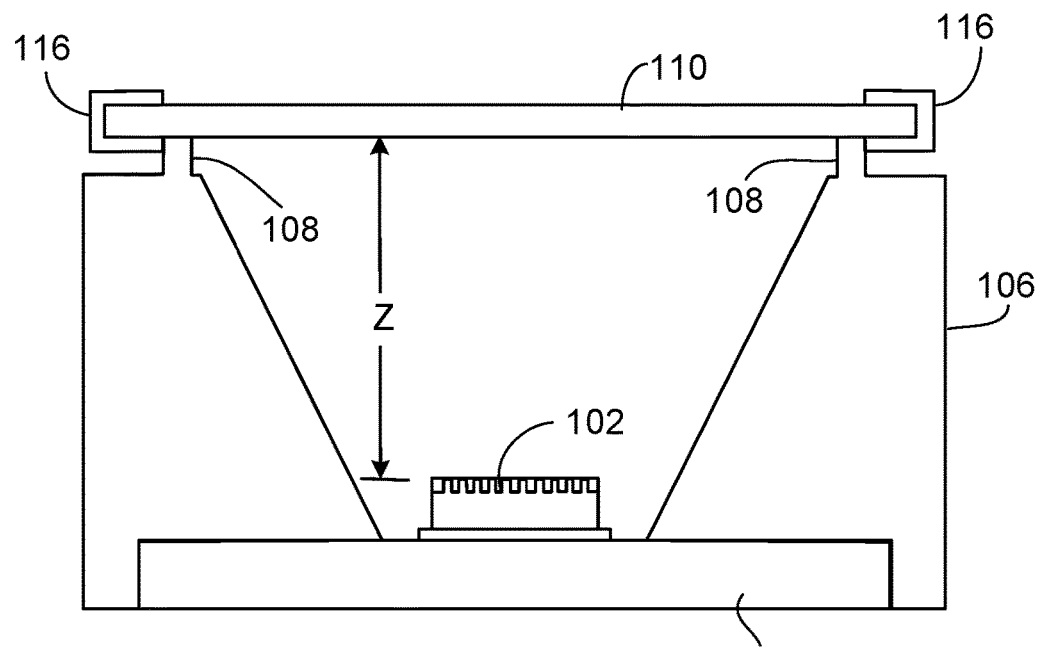
Figure 1C:
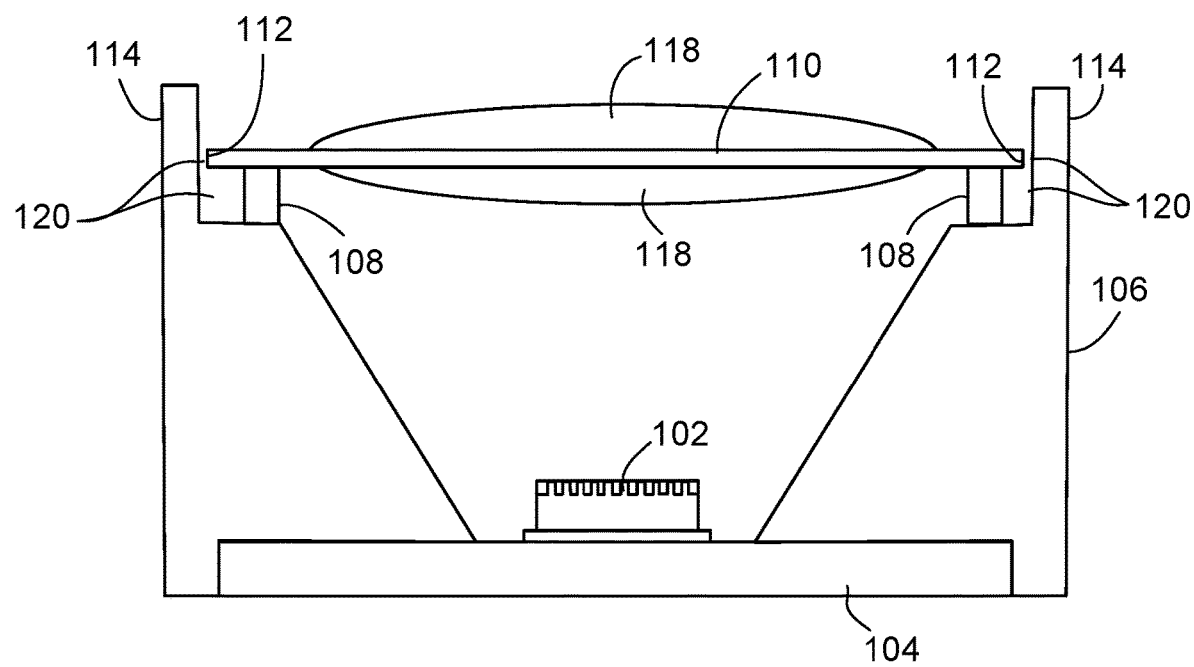

In some cases, as shown in FIG. 1B, the side edges 112 of the cover 110 are embedded within non-transparent encapsulant 116. The walls 114 or encapsulant 116 can be composed, for example, of the same material as the housing 106. In some cases, as illustrated in FIG. 1C, one or more beam shaping elements such as lenses 118 are provided on one or both surfaces of the cover 110. The beam shaping elements 118 and transparent cover 110 together constitute an optical assembly. In some instances, the side walls 114 that laterally surround the cover 110 extend beyond the outer surface of the cover 110 and serve as a baffle.

In some implementations, a single vertical alignment feature 108 is provided near the entirety of the cover's edge(s). In other instances, multiple (e.g., three) discrete vertical alignment features 108 can be provided (see FIG. 2). In any event, one function of the vertical alignment feature(s) 108 is to provide a precisely defined gap between the cover 110 and the light emitter 102.

Figure 3A:
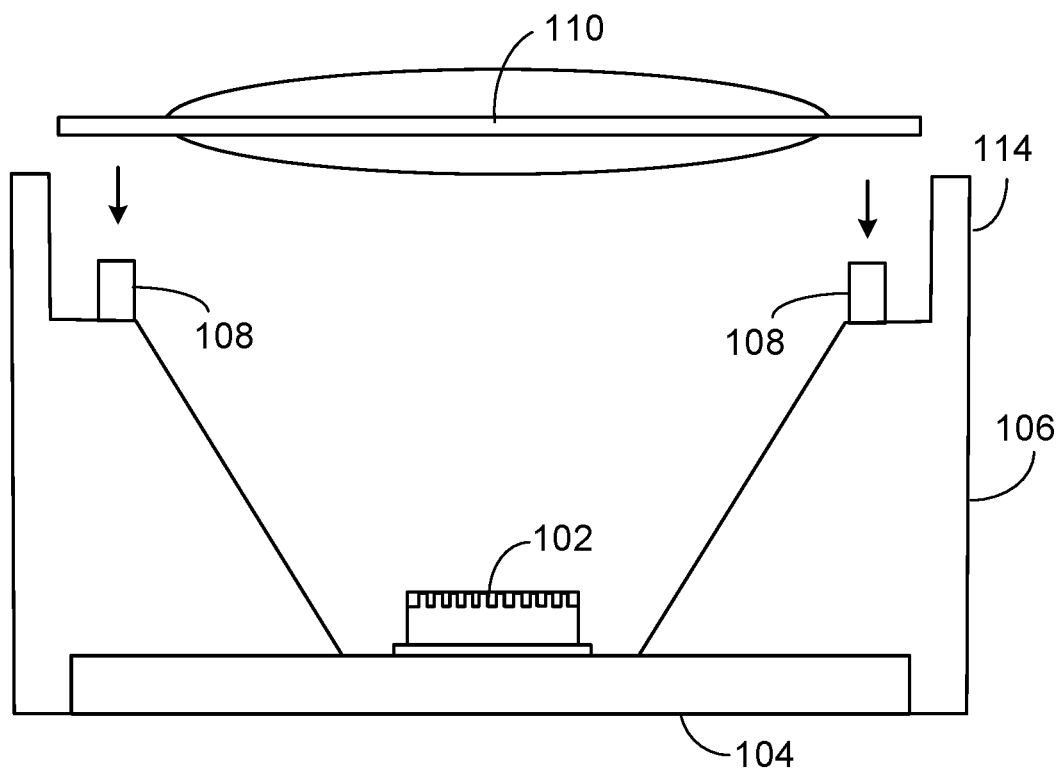
FIGS. 3A and 3B illustrate examples of fabricating modules with one or more vertical alignment features.

During fabrication of the module, the vertical alignment features 108 can be machined, as needed, so as to adjust their height and thus achieve a precise pre-specified distance between the cover 110 and the light emitter 102. For example, in some cases, the vertical alignment feature(s) 108 are formed, by injection molding and are formed as a unitary piece with (and are composed of the same material as) the housing 106 (see FIG. 3A). Various measurements can be performed during fabrication of the modules to determine whether, and by how much, the vertical alignment feature(s) 108 should be machined. In some instances, the amount of machining may vary from one vertical alignment feature 108 to the next to correct, for example, for tilt. After machining the vertical alignment feature(s) 108, as needed, to the desired height, the cover 110 can be placed in direct contact over the vertical alignment feature(s) 108. To provide accurate spacing between the cover 110 and the light emitter 102, the cover 110 is not attached to the vertical alignment feature(s) 108 by adhesive. Instead, adhesive can be provided, for example, in areas 120 between the side edges of the cover 110 and the housing 106 and/or side walls 114 (see FIG. 1C). An example of a suitable adhesive in this and other implementations is a UV-curable epoxy.

Figure 3B:
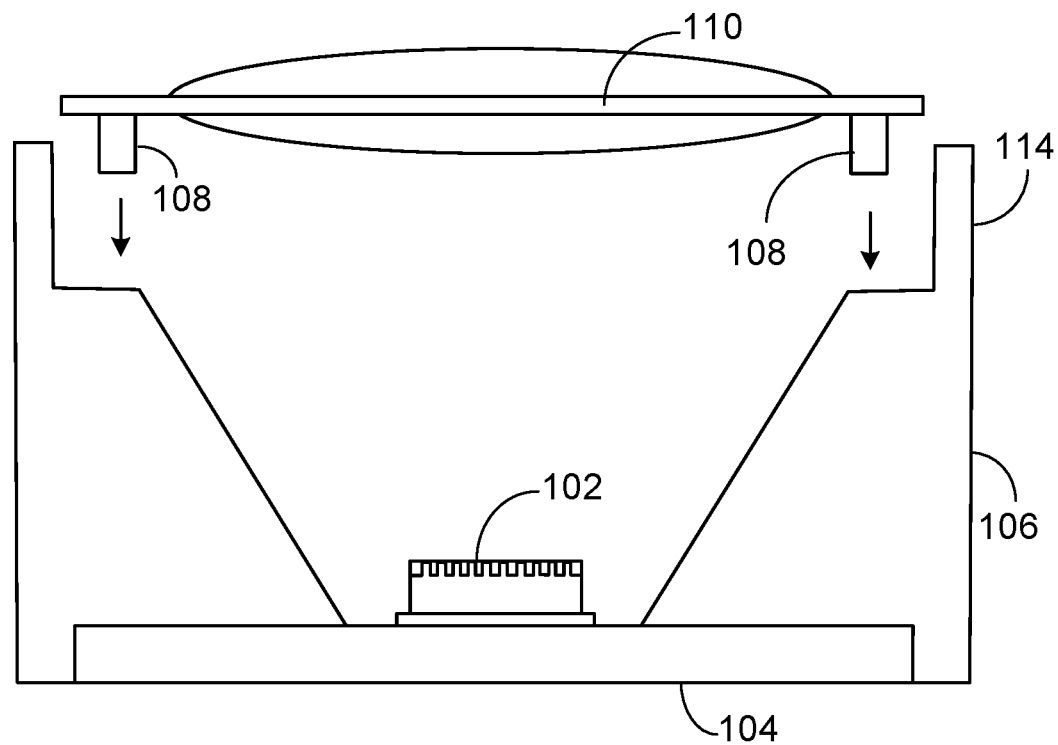

In some instances, the vertical alignment feature(s) 108 initially are provided (e.g., by replication) on the emitter-side of the cover 110 and then machined, as needed, to the desire height, before placing them in direct contact over the housing (see FIG. 3B). An advantage of this technique is that the vertical alignment feature(s) 108 can be machined separately from the housing 106, thereby avoiding possible contamination of the light emitter 102.

Figure 4A:
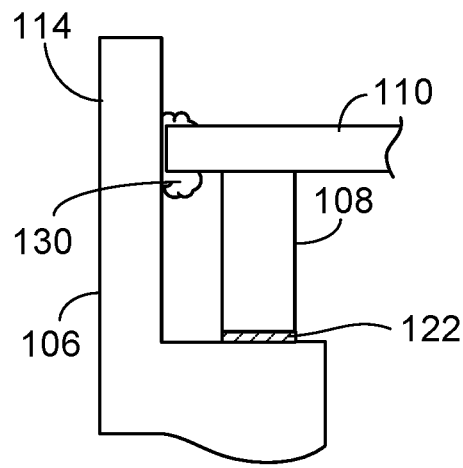
FIGS. 4A-4C are enlarged, partial depictions of surfaces that can be machined to obtain a desired z-height.
Figure 4B:
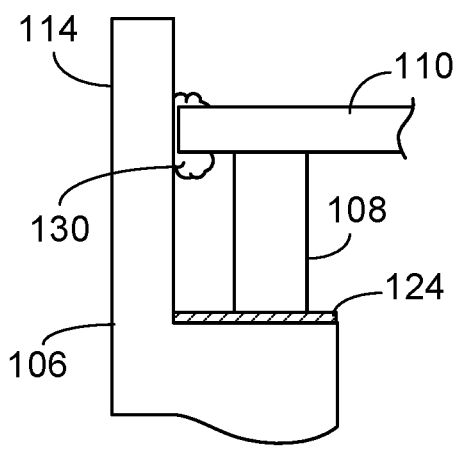
Figure 4C:
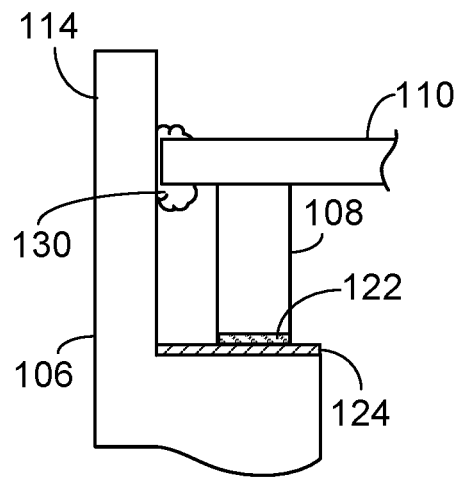

In some cases, in addition to, or instead of, machining the surface of the vertical alignment feature(s) 108, the surface of the housing 106 can be machined. FIGS. 4A-4C are enlarged, partial views that illustrate examples of the surface(s) 122, 124 that can be machined to achieve a specified z-height (i.e., distance between the light emitter 102 and the optical element 110). The surface 122 is a contact surface of the vertical alignment feature 108, whereas the surface 124 is an opposing contact surface. These figures also illustrate an example of the location of the adhesive 130 for fixing the cover 110 in place over the housing 106 (i.e., at side edges of the cover 110).

Figure 5A:
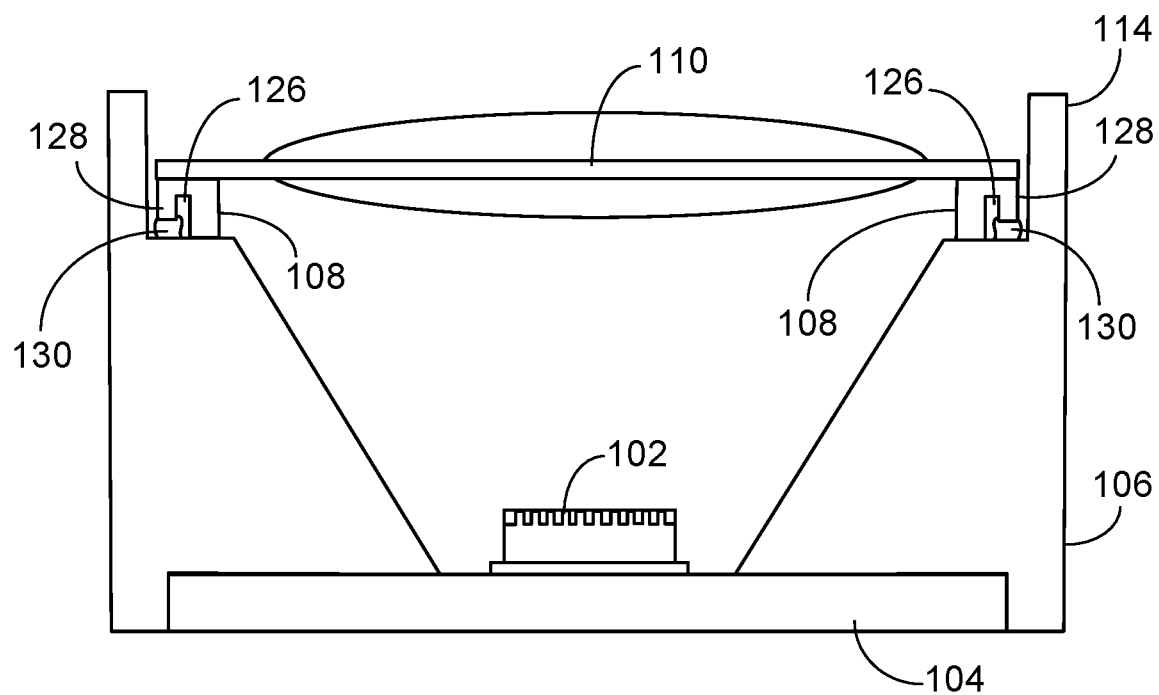
FIG. 5A illustrates a cross-sectional view of another light emitter module.
Figure 5B:
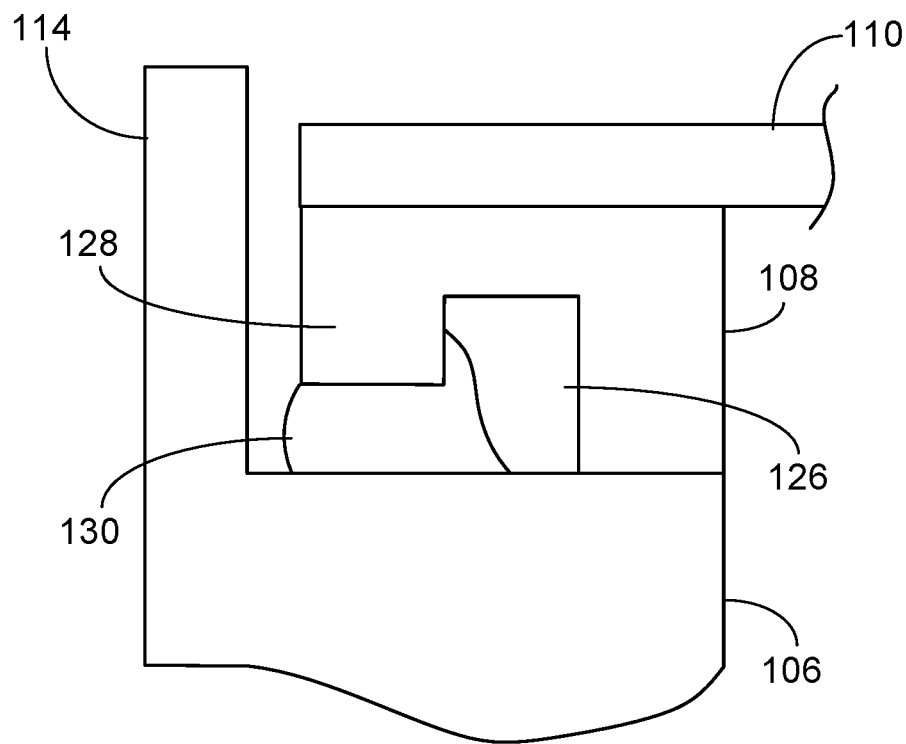
FIG. 5B is an enlarged partial view of FIG. 5A.

In some instances, an adhesive channel 126 is provided adjacent each vertical alignment feature 108, as shown in FIGS. 5A and 5B. The adhesive channel 126 can be located between the vertical alignment feature 108 and an extension 128 that projects downward from the emitter-side surface of the cover 110 and that is slightly shorter than the vertical alignment feature 108. The extension 128 can be formed, for example, by injection molding as a unitary piece with, and composed of the same material as, the vertical alignment feature 108. During fabrication, when the cover 110 is placed over the housing, the emitter-side surface of the vertical alignment feature 108 is placed in direct contact with the surface of the housing 106 so as to establish the desired height between the light emitter 102 and the cover 110. Adhesive 130 between the emitter-side surface of the extension 128 and the surface of the housing 106 fixes the cover 110 in place.

Preferably, the shape and dimensions of the channel 126 help prevent adhesive 130 from getting between the vertical alignment feature 108 and the underlying surface of the housing 106. In particular, capillary forces and the wettability of the adhesive to the material of the vertical alignment features can help keep the adhesive away from the vertical alignment feature(s). The contact angle between the adhesive and the vertical alignment feature, and the channel dimensions, can be designed with this goal in mind.

Figure 6A:
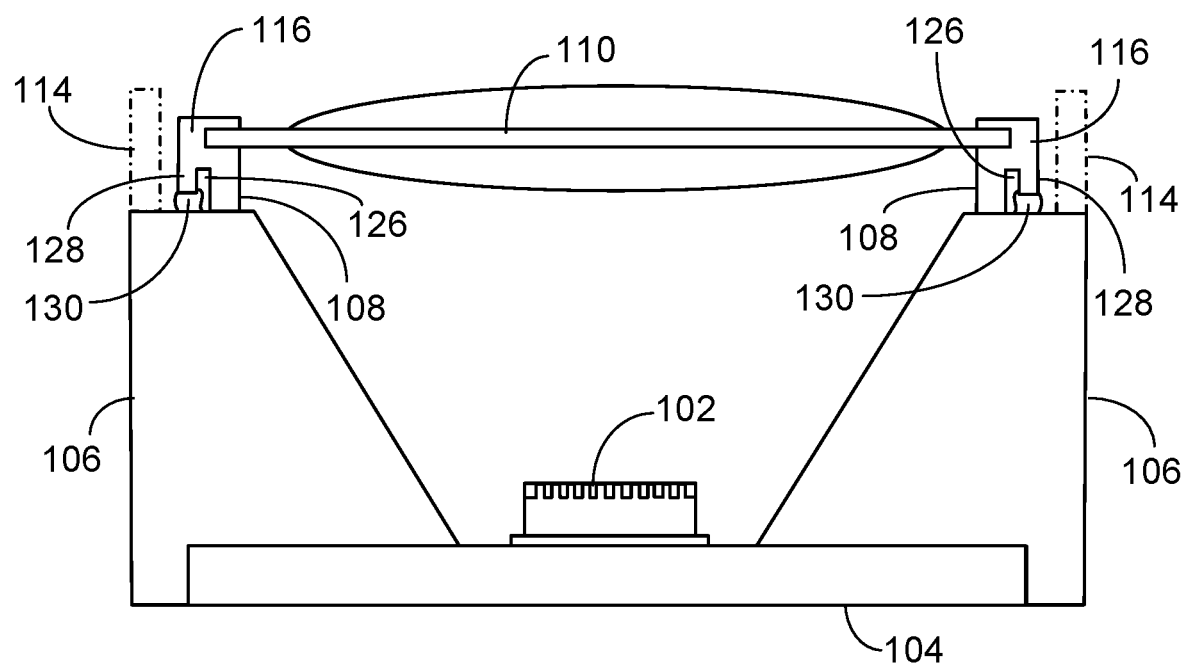
FIG. 6A illustrates a cross-sectional view of yet another light emitter module.
Figure 6B:
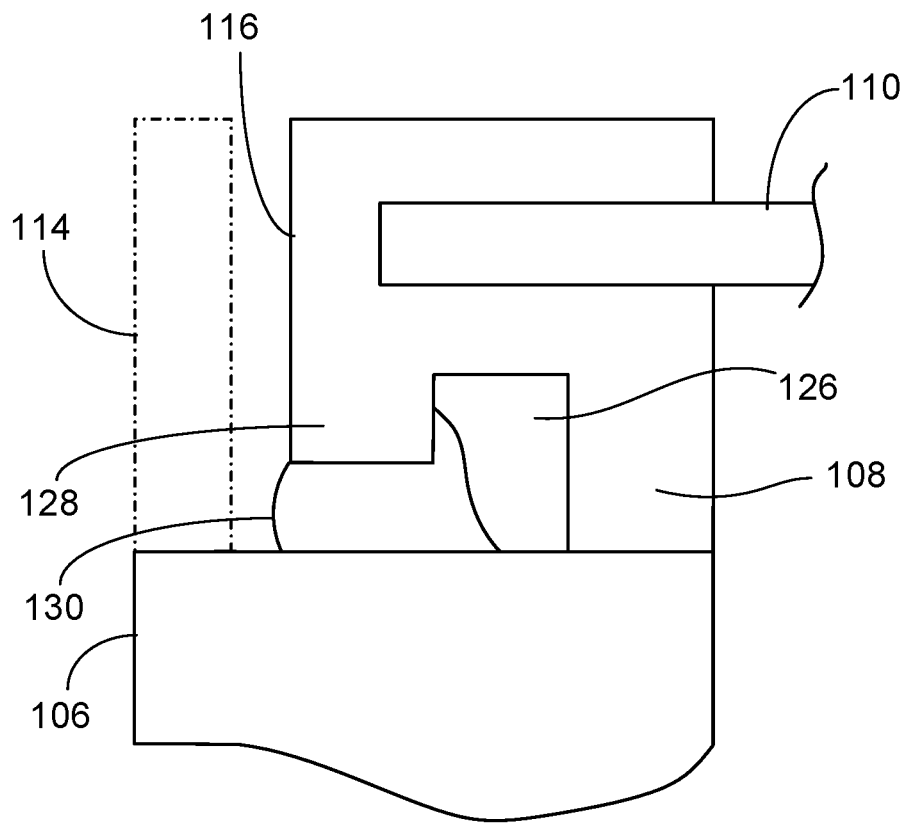
FIG. 6B is an enlarged partial view of FIG. 6B.

In some implementations, as shown in FIGS. 6A and 6B, the extension 128 adjacent the adhesive channel 126 also can be formed as a unitary piece with (and composed of the same material as) the encapsulation material 116 that laterally surrounds the side edges of the cover 110. As in the other implementations, the height of the vertical alignment feature(s) 108 can be customized, as needed, by machining to reduce their height. In the resulting module, each vertical alignment feature 108 rests directly on the housing 106 (i.e., without adhesive at the interface between the alignment feature and housing) so as to provide the desired height between the light emitter 102 and the cover 110. As the material 116 that encapsulates the side edges of the cover 110 helps prevent light leakage from the module, the baffle walls 114 can be omitted in some instances. Nevertheless, in some cases, it still may be helpful to provide the baffle walls 114, which can facilitate lateral alignment of the cover 110 and vertical alignment feature(s) 108.

Figure 7A:
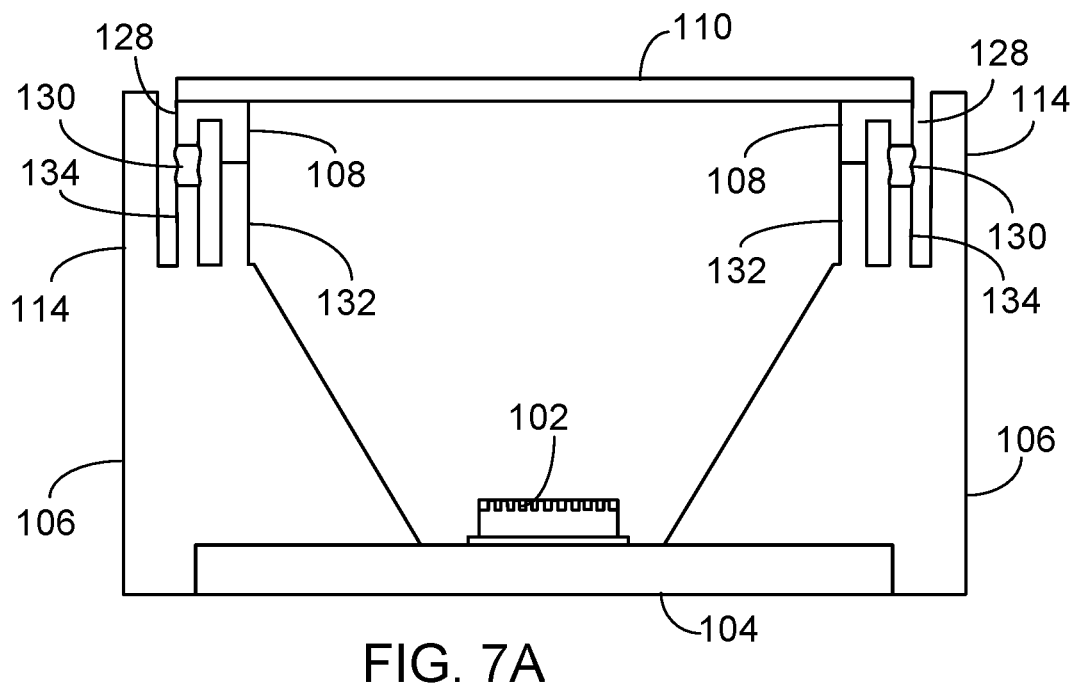
FIG. 7A illustrates a cross-sectional view of another light emitter module.
Figure 7B:
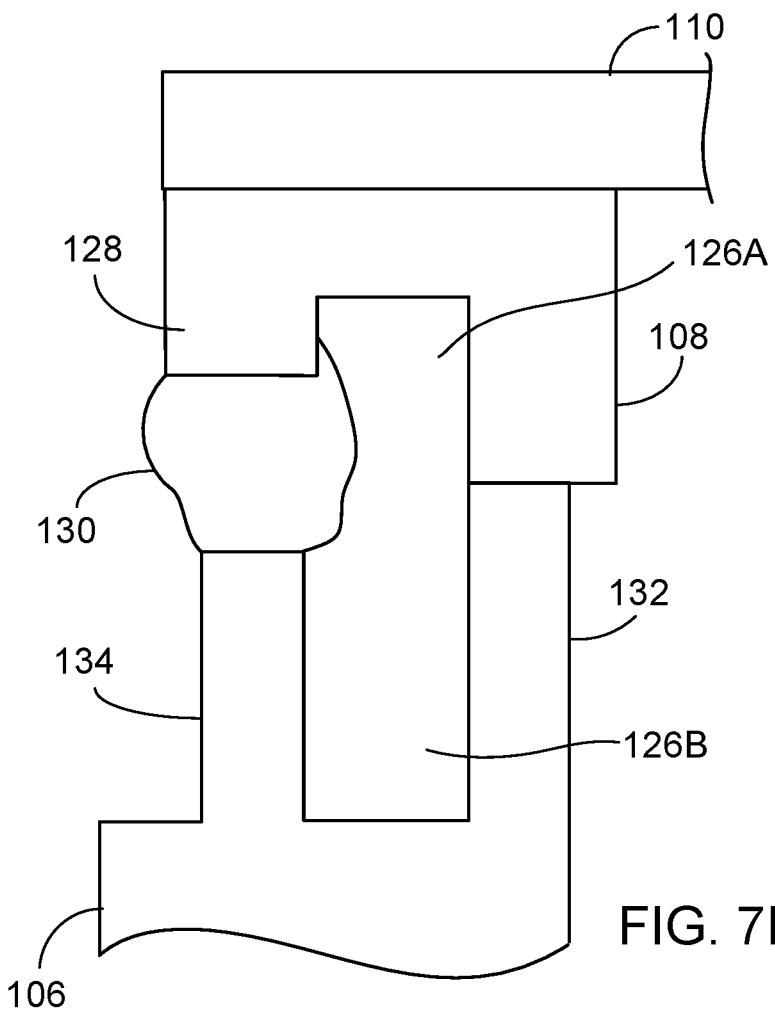
FIG. 7B is an enlarged partial view of FIG. 7A.

As illustrated in FIGS. 7A and 7B, some implementations include second vertical alignment feature(s) 132 and second extension(s) 134, each of which projects from the upper surface of the housing 106. Each second vertical alignment feature 132 is aligned with a corresponding vertical alignment feature 108 that projects from the cover 110. The surfaces of one or both upper and lower vertical alignment features 108, 132 can be machined, as needed, to the desired height before they are brought into direct (mechanical) contact with one another such their respective opposing surfaces abut one another. Further, each second extension 134 is aligned with a corresponding extension 128. However, the extensions 128, 134 are not brought directly into contact with one another. Instead, the extensions 128, 134 serve, respectively, as upper and lower attachment features that are attached to one another by adhesive 130 to fix the cover 110 in place over the housing 106. Upper and lower adhesive channels 126A, 126B can help prevent the adhesive 130 from flowing too close to the vertical alignment features 108, 132. Thus, the combined heights of the upper and lower vertical alignment features 108, 132 help achieve a precise specified distance between the light emitter 102 and the cover 110, whereas the extensions 128, 134 and the adhesive 130 fix the cover 110 to the housing 110.

Figure 8A:
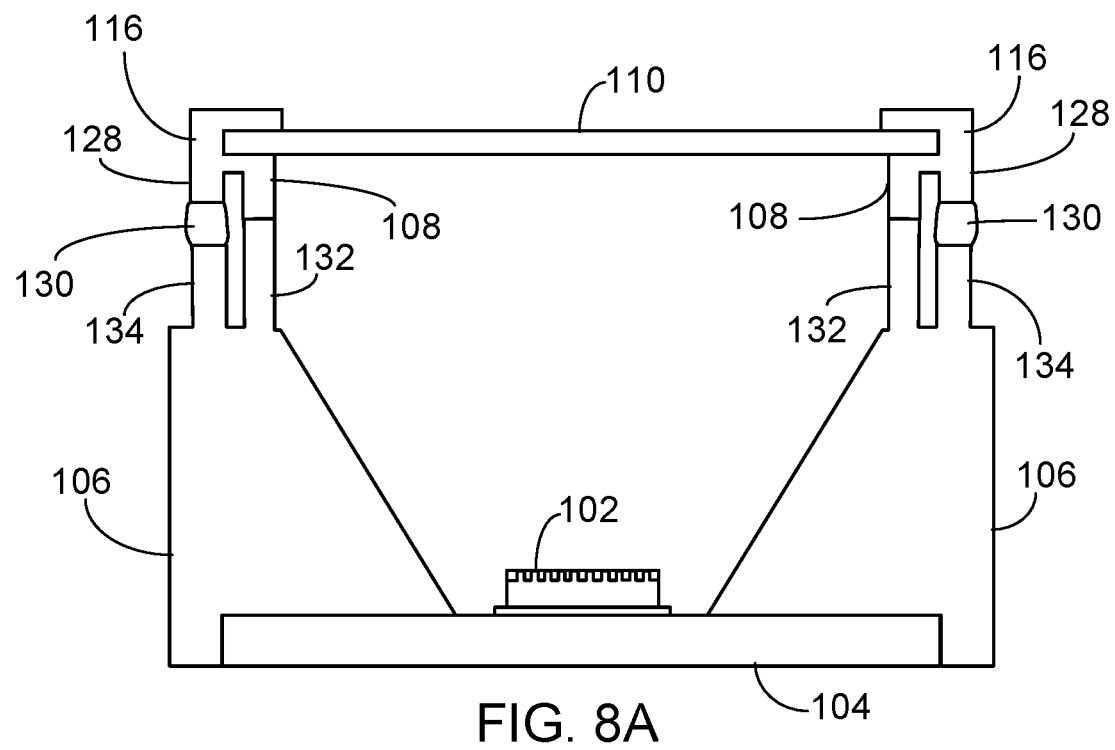
FIG. 8A illustrates a cross-sectional view of yet another light emitter module.
Figure 8B:
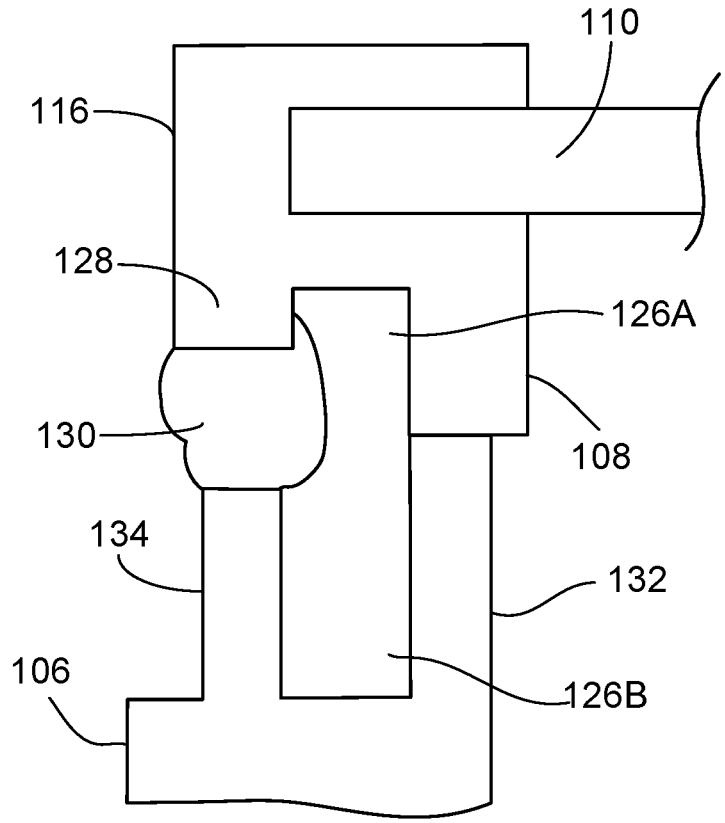
FIG. 8B is an enlarged partial view of FIG. 8A.

FIGS. 8A and 8B illustrate an example of another module that includes second vertical alignment feature(s) 132 and second extension(s) 134, each of which projects from the upper surface of the housing 106. Thus, like the module in FIGS. 7A and 7B, the module in FIGS. 8A and 8B includes both upper and lower vertical alignment features. Further, the side edges of the cover 110 of the module in FIGS. 8A and 8B are encapsulated laterally by opaque material 116 that can be formed as a unitary piece with (and composed of the same material as) the vertical alignment feature 108 and extension 128. As the material 116 that encapsulates the side edges of the cover 110 helps prevent light leakage from the module, the baffle walls 114 may be omitted in some instances.

Figure 9A:
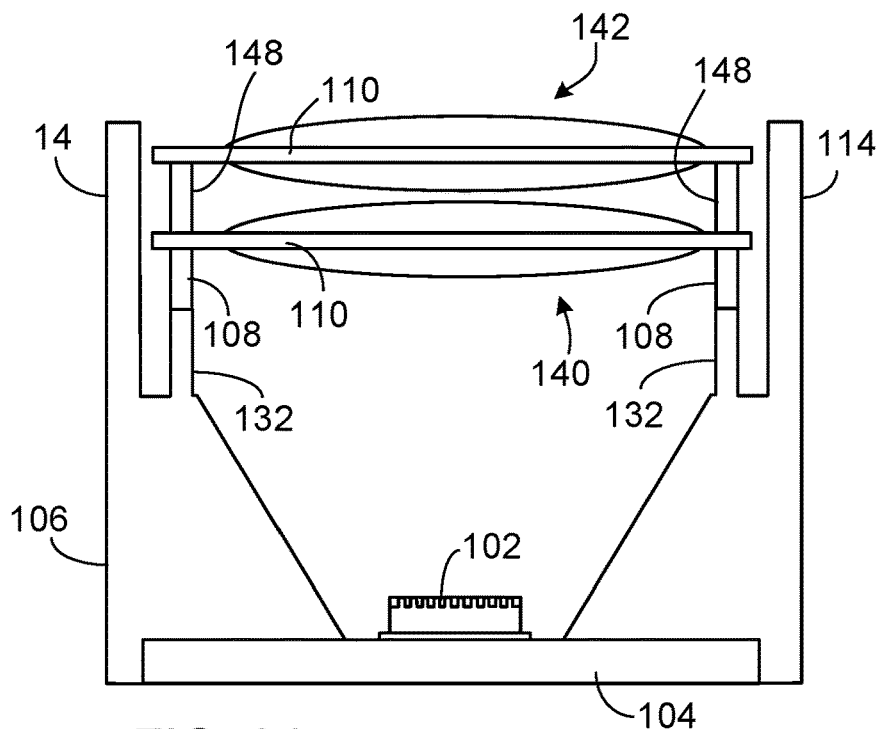
FIG. 9A illustrates a cross-sectional view of a light emitter module that includes a stack of optical assemblies.
Figure 9B:
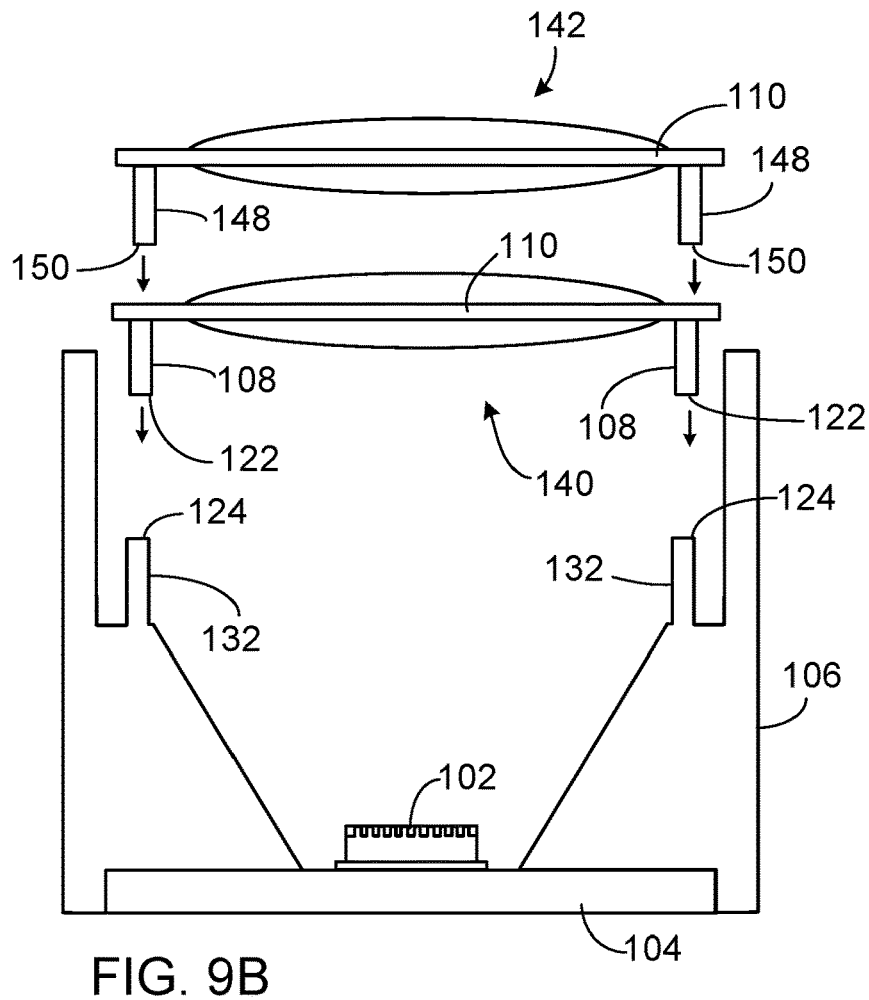
FIGS. 9B and 9C are exploded views of FIG. 9A.
Figure 9C:
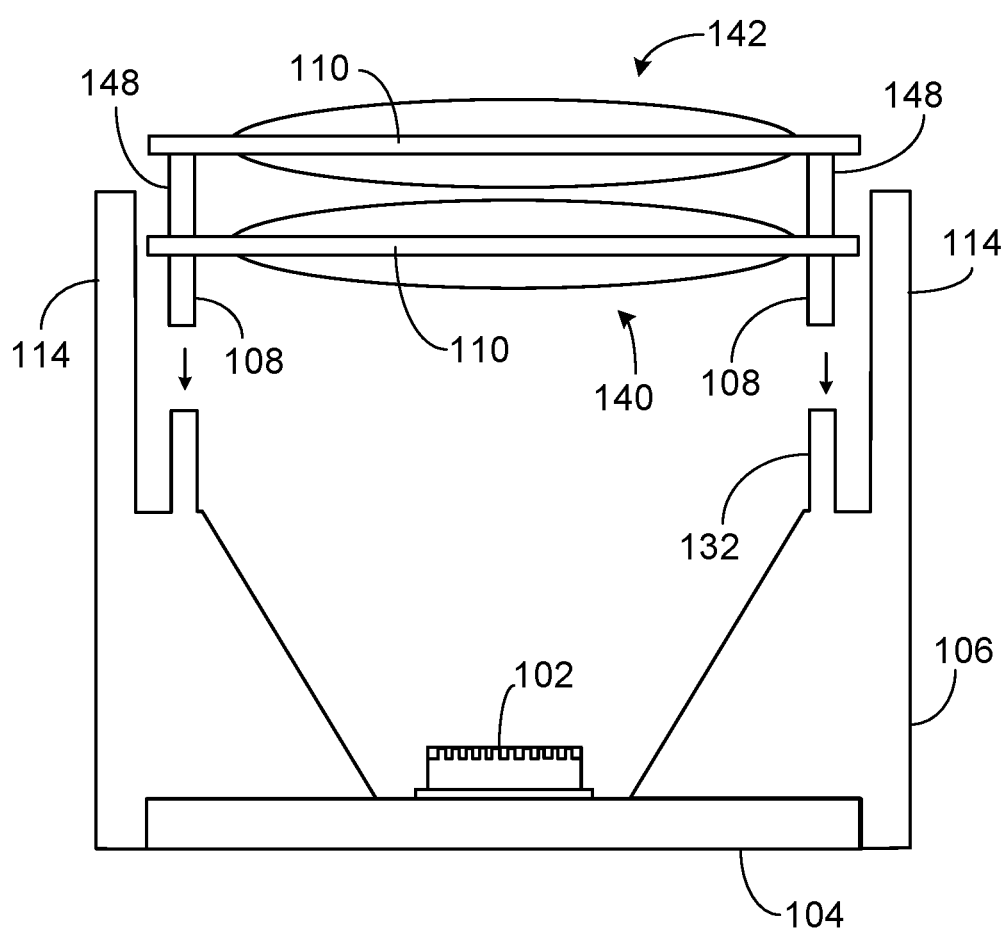

Customizable vertical alignment features also can be used to stack multiple optical assemblies one over the other. An example is illustrated in FIG. 9A, which shows a module that includes a stack of first and second optical assemblies 140, 142. The optical assemblies 140, 142 may be separated from one another by one or more customizable vertical alignment feature(s) 148 that are on the emitter-side surface of the transparent plate 110 of the upper assembly 142. The emitter-side surface of the vertical alignment feature(s) 148 rests directly (i.e., without adhesive) on the upper surface of the transparent plate 110 of the lower assembly 140. As shown in FIG. 9B, in some implementations, the lower optical assembly 140 is placed on vertical alignment feature(s) 132 extending from the housing 106, and subsequently the upper assembly 142 is placed on the lower assembly 140. The optical assemblies 140, 142 can be fixed in place, for example, by using adhesive between the side edges of the optical elements 110 and the upper sidewalls 114 of the module, as illustrated in FIG. 4A. Prior to placing the optical assemblies 140, 142 over the housing 106, one or more of the vertical alignment surfaces 122, 124, 150 can be machined so that the distance from the light emitter 102 is in accordance with a specified value. In some implementations, as shown in FIG. 9C, the optical assemblies 140, 142 can be stacked one on the other, and then the entire stack can be placed on the vertical alignment feature(s) 132.

Figure 10A:
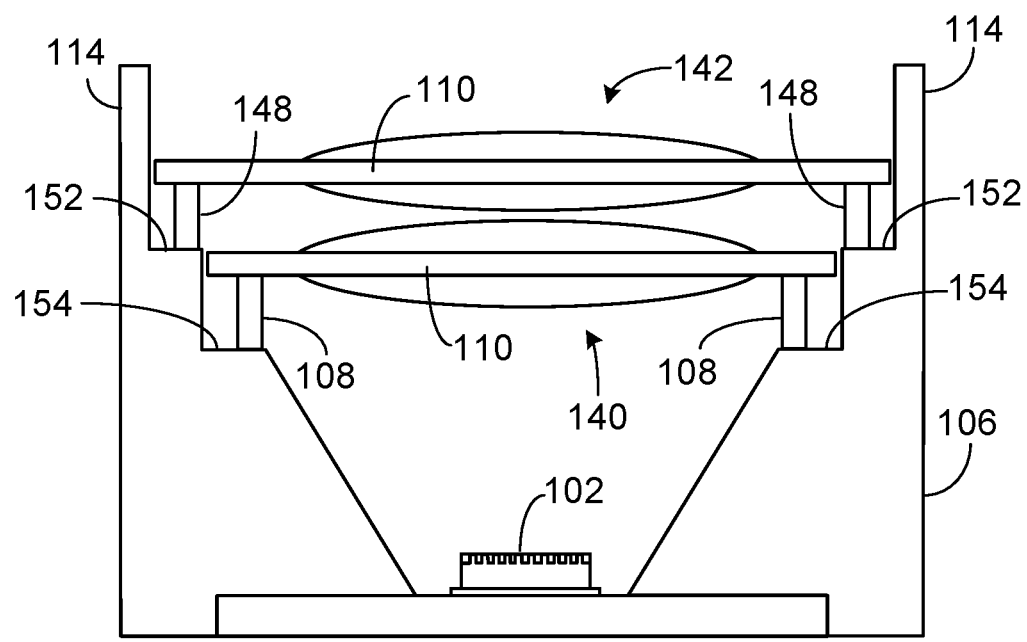
FIG. 10A is a cross-sectional view of another light emitter module that includes a stack of optical assemblies.
Figure 10B:
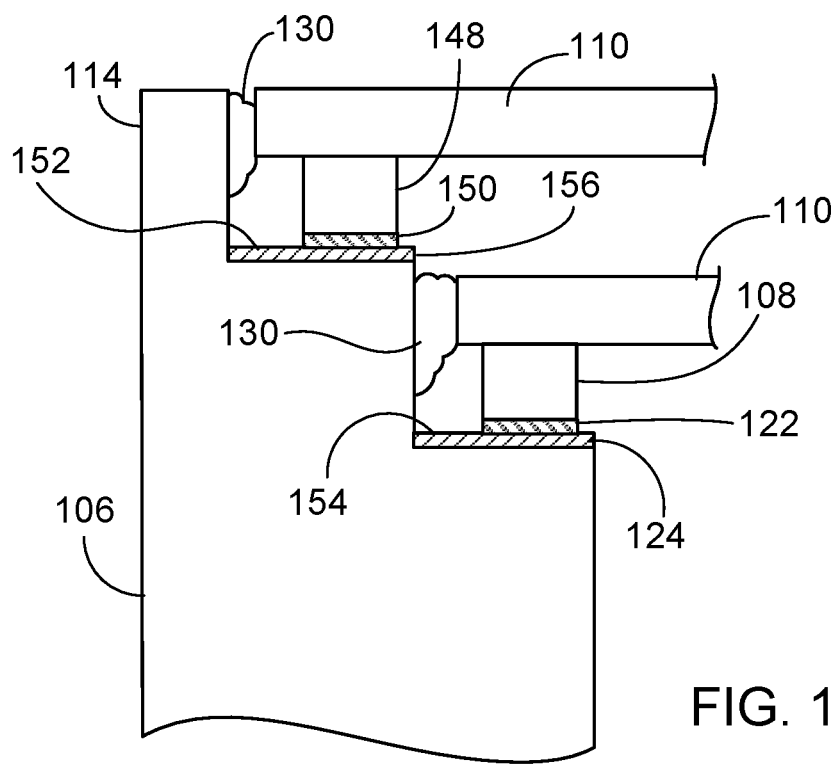
FIG. 10B is an enlarged partial view of FIG. 10A.

In some cases, as shown in FIG. 10A, the vertical alignment features 148 of the upper optical assembly 142 can rest directly on an upper ledge 152 of the housing 106, just as the vertical alignment features 108 of the lower optical assembly 140 rest on a lower ledge 154. As illustrated in FIG. 10B, one or more surfaces 122, 124, 150, 156 of the vertical alignment features 108, 148 or ledges 152, 154 can be machined, as needed, prior to positioning the optical assemblies 140, 142 so as to provide the desired relative distance between the light emitter 102 and each optical assembly. The optical assemblies 140, 142 can be fixed in place, for example, by adhesive 130 between their side edges and the inner-facing surface(s) of the housing 106.

Figure 11:
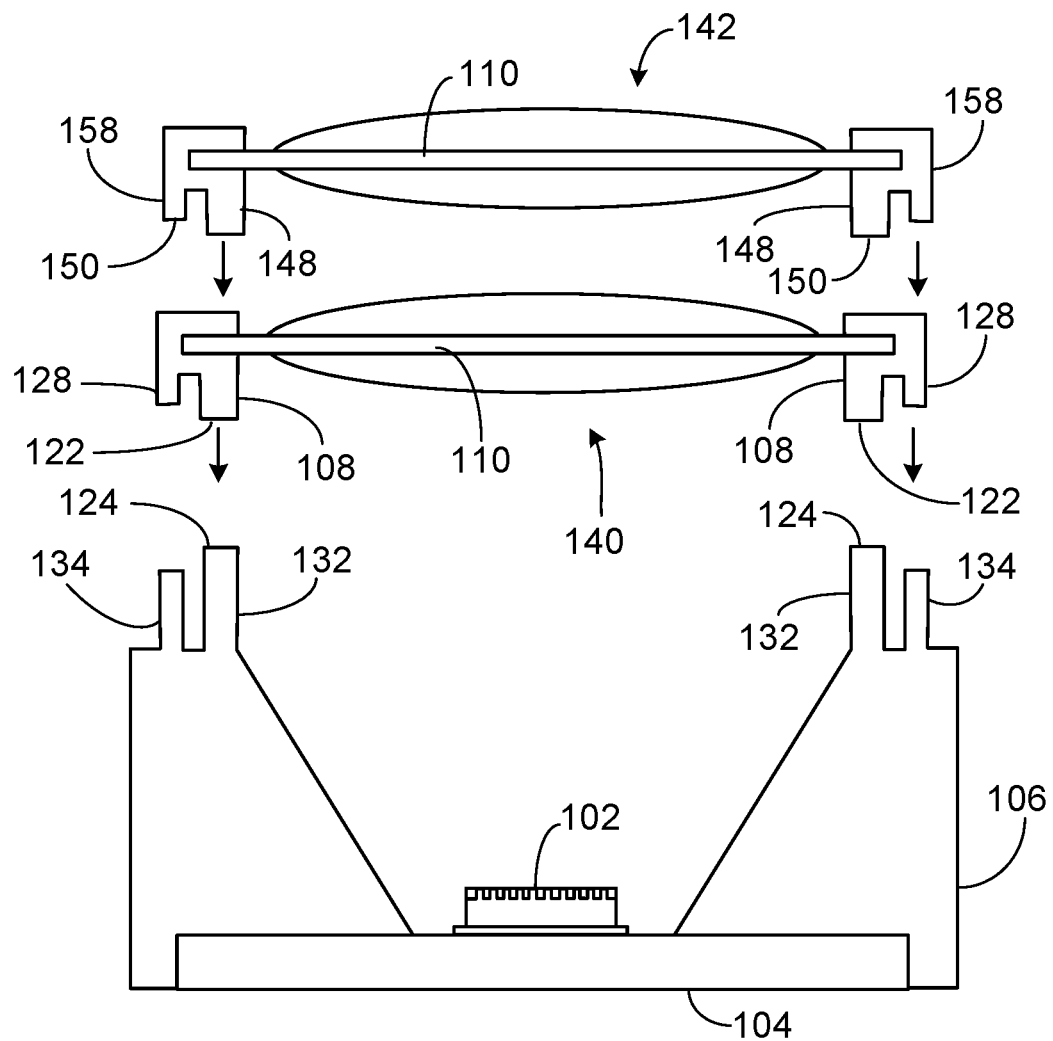
FIG. 11 shows a further example of a light emitter module that includes a stack of optical assemblies.

As illustrated in FIG. 11, a stack of optical assemblies 140, 142 also can be placed on the housing using some of the features described in connection with FIGS. 7A and 8A (i.e., an adhesive channel formed between the vertical alignment feature 108/148 and a corresponding extension 128/158 projecting from the emitter-side of the transparent plate 110). Also, in some cases, the side edges of the optical elements 110 can be encapsulated by opaque material, as described above in connection with FIG. 8A. One or more of the contact surfaces 122, 124, 150 of the vertical alignment features 108, 132, 148 can be machined, as needed, prior to positioning the optical assemblies 140, 142 so as to achieve the desired distance between the light emitter 102 and each optical assembly. As in the previously described examples, there is no adhesive at the contact surfaces 122, 124, 150, which allows the distance to the emitter 102 to be established precisely. Instead, the adhesive can be provided at the surfaces of the extensions 134, 128, 158.

Figure 12A:
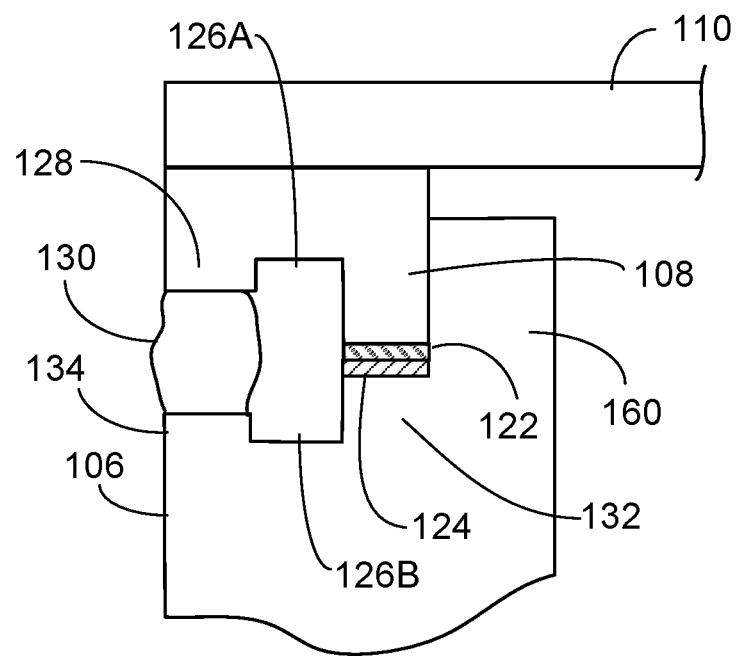
FIGS. 12A and 12B are enlarged, partial views of modules that include vertical and lateral alignment features.
Figure 12B:
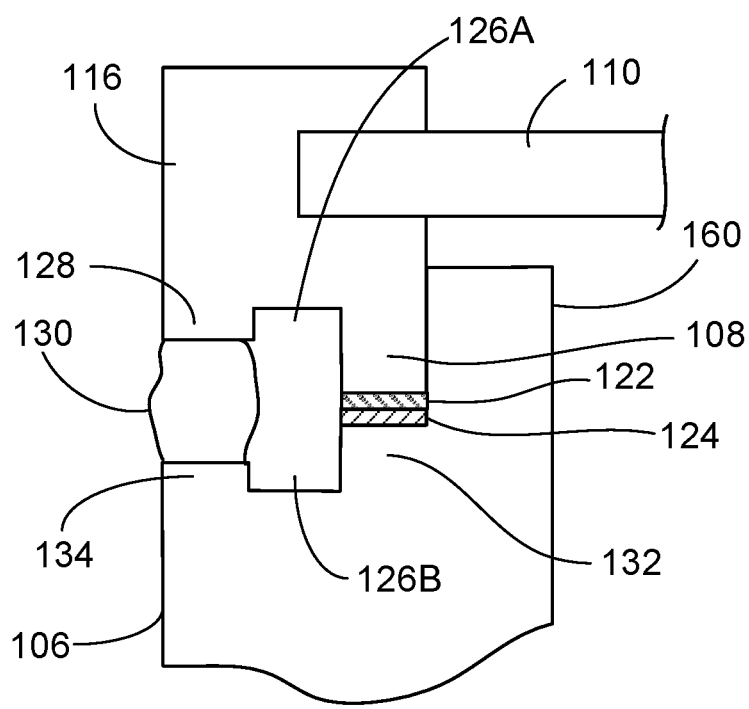
Figure 13A:
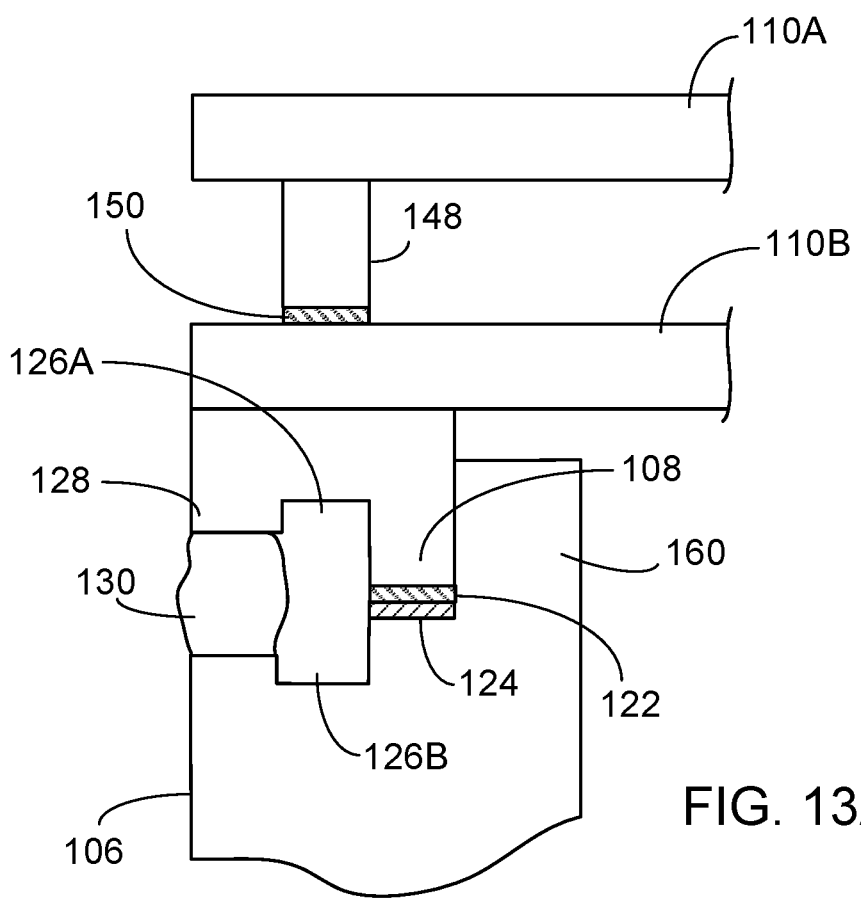
FIGS. 13A and 13B are enlarged, partial views of other modules that include vertical and lateral alignment features.
Figure 13B:
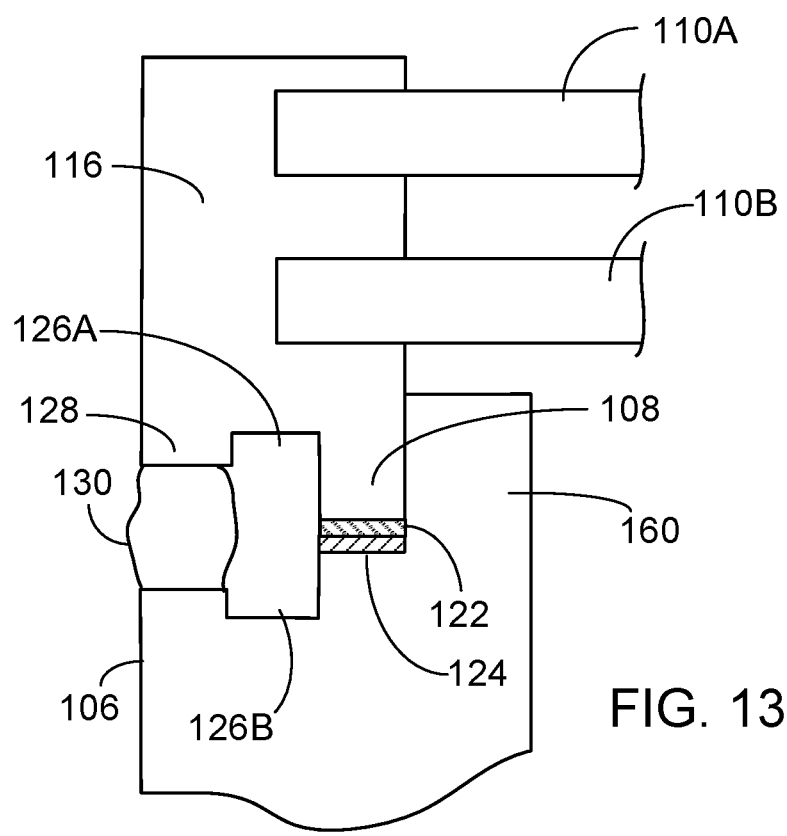

In addition to the vertical alignment features (e.g., 108, 132), some implementations include lateral alignment features 160, as illustrated, for example, in FIGS. 12A and 12B. The lateral alignment feature 160 can be formed, for example, as a unitary piece with (and can be composed of the same material as) the lower vertical alignment feature 132 and the housing 106. In particular, the lateral alignment feature 160 can take the form of an extension that projects from the housing next to the lower vertical alignment feature 132. The lateral alignment feature(s) 160 can facilitate placement of the upper vertical alignment feature(s) 108 onto the lower vertical alignment features(s) 132. In the resulting module, a side of each lateral alignment feature 160 is in direct contact with a side of a corresponding upper vertical alignment feature 108. Further, the lateral alignment feature(s) 160 can help protect the light emitter 102 from small particles resulting from machining of the surfaces 122, 124. In some cases, a stack of optical assemblies can be provided. As shown in FIG. 13A, the upper optical element 110A can be separated from the lower optical element 110B by a vertical alignment feature (i.e., a stud or spacer) 148. The contact surface 150 of the vertical alignment feature 148 can be machined prior to bringing it into contact with the lower optical element 110B so as to achieve a desired distance between the light emitter 102 and the upper optical element 110A. In other instances, as illustrated in FIG. 13B, the side edges of both covers 110A, 110B can be encapsulated laterally by opaque material 116. Here too, the encapsulation material 116 can be formed as a unitary piece with (and composed of the same material) as the vertical alignment feature 108 and the extension 128. In some cases, the lateral alignment feature 160 may be omitted.

As is apparent from the foregoing detailed description, contact surfaces of the vertical alignment features, or of the ledge(s) and other surfaces on which they rest, can be machined to achieve a precisely defined distance between the light emitter and an optical element in the module. The extent of any machining that may be needed can be based, for example, on various measurements made during the fabrication process. The entire process may, in some cases, be automated.

Figure 2:
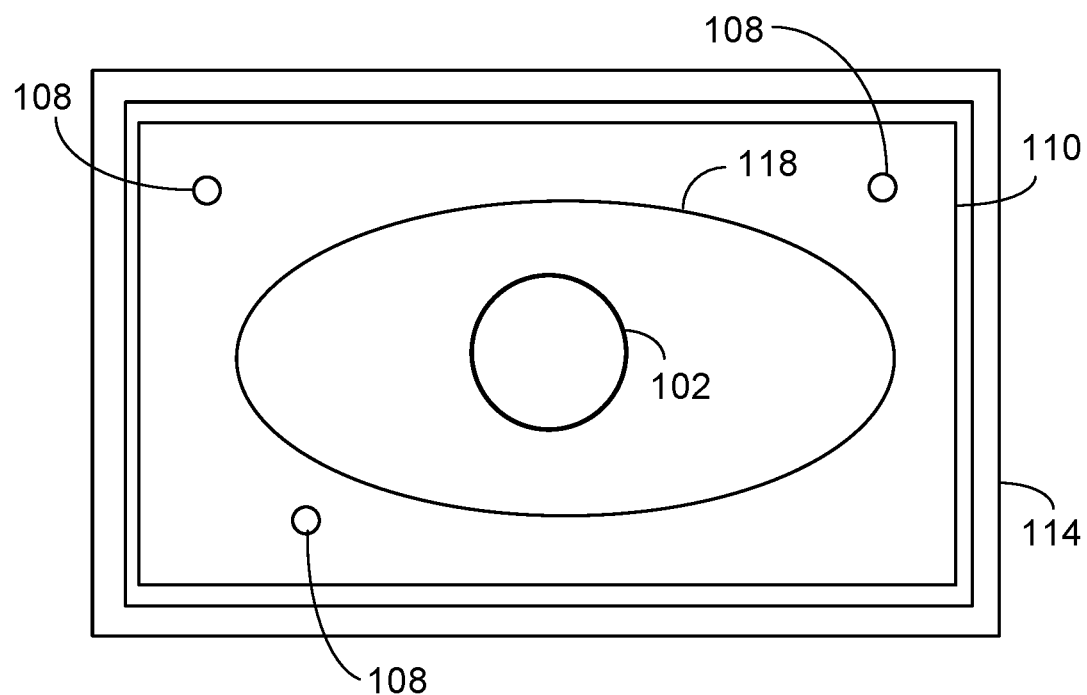
FIG. 2 is a top view of a module including discrete vertical alignment features to set the z-height between the light emitter and the cover.

In the foregoing implementations, the vertical alignment features (e.g., 108, 132, 148) can be implemented, for example, either as a single contiguous spacer or as multiple discrete studs/spacers (see FIG. 2).

Figure 14:
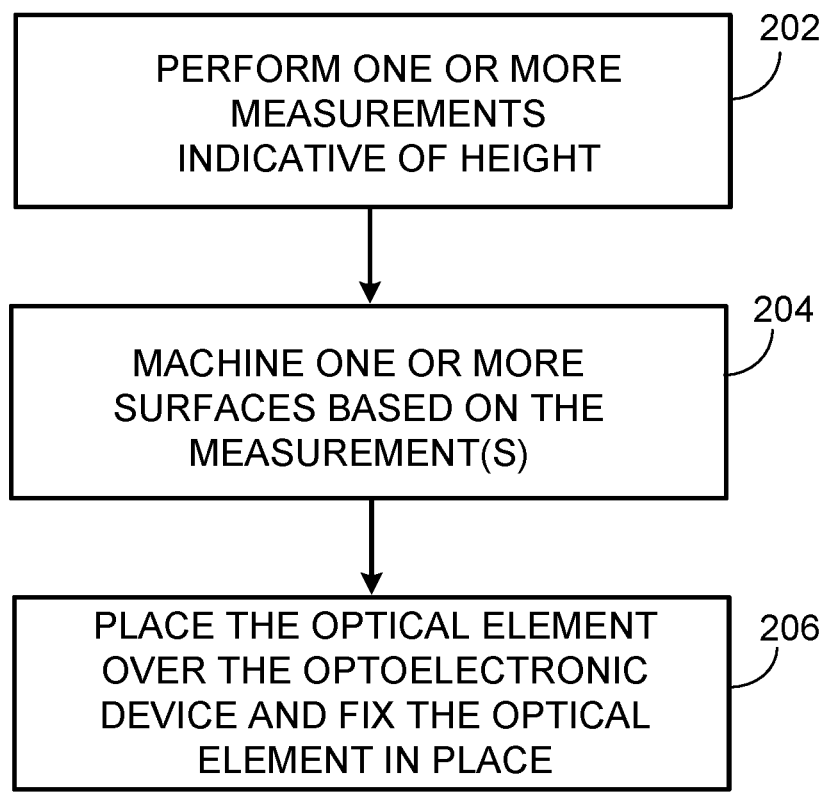
FIG. 14 is a flow chart including steps for fabricating a light emitter module.

As indicated by the various examples described above, during fabrication of the modules, one or more measurements can be made prior to fixing an optical element (e.g., cover 110 or optical assembly 140, 142) in place over the light emitter 102 (see FIG. 14, block 202). The measurements can be indicative of a height in the direction of the module's optical axis (i.e., parallel to arrow 111 in FIG. 1). For example, the measurement(s) may include focal-length measurements of the optical element, and/or the height of the housing and/or vertical alignment features may be measured optically prior to or during machining. Based on the optical measurement(s), one or more surfaces can be machined, as necessary, to establish precisely a specified distance between the light emitter and the optical element (block 204). The machined surfaces may include a contact surface of a vertical alignment feature and/or an opposing contact surface for the vertical alignment feature (i.e., a surface that abuts the contact surface of the vertical alignment feature when the optical element is fixed in place over the light emitter). Although the surface that abuts the contact surface of the vertical alignment feature when the optical element is fixed in place over the light emitter may be referred to as an "opposing contact surface," that surface need not necessarily be opposite the contact surface of the vertical alignment feature when the surfaces are machined. After performing the machining (if any), the optical element is placed over the light emitter such that the one or more vertical alignment feature(s) separate the optical element from the module's housing and the optical element is fixed in place (block 206). Adhesive is not used at any interfaces with the vertical alignment features. Instead, the optical element can be fixed to the housing by providing adhesive at other locations (e.g., along the side edges of the optical element or at a separate adhesive attachment surface. In some implementations, multiple modules can be fabricated in parallel using a wafer-level process.

Figure 15:
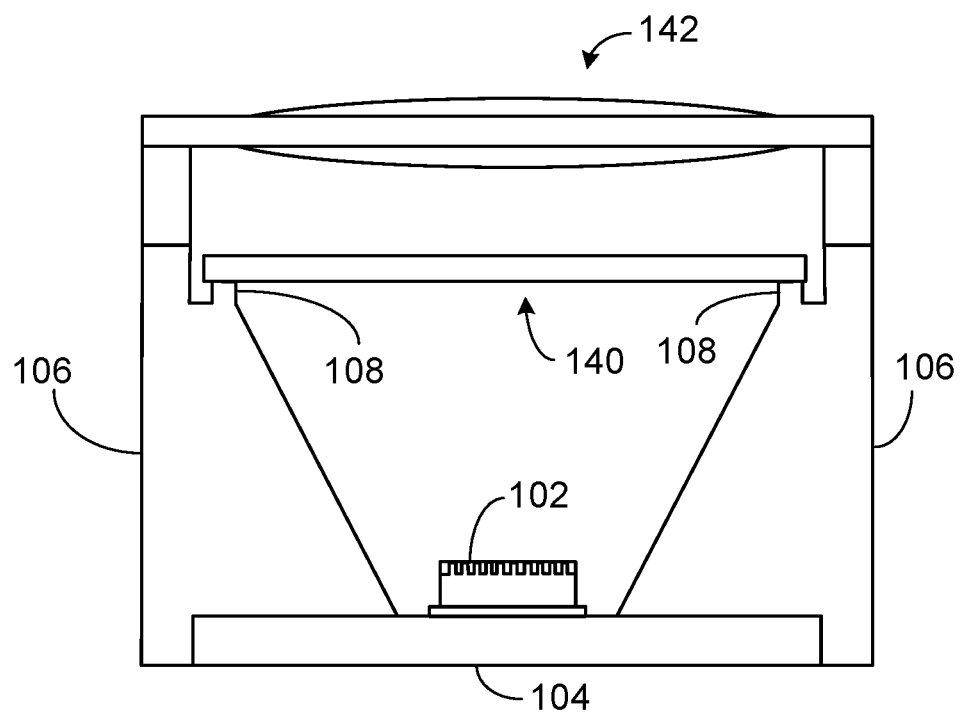
FIG. 15 illustrates an example of a module including at least one optical member composed of glass.

In some implementations, a module including vertical alignment features as described above also can include other features to provide a precision packaged light emitter module that is relatively stable over a wide temperature range. For example, although the optical element (e.g., 110, 140, 142) can be composed of a polymer material, in some implementations, to reduce thermally induced dimensional changes (e.g., changes in z-height), one or more of the optical elements can be composed of glass, which typically has a lower thermal expansion than many polymers. An example is illustrated in FIG. 15, which shows a module that a first optical element 140 composed of a polymer material. The module also includes a second optical element 142 composed of a glass lens.

Figure 16:
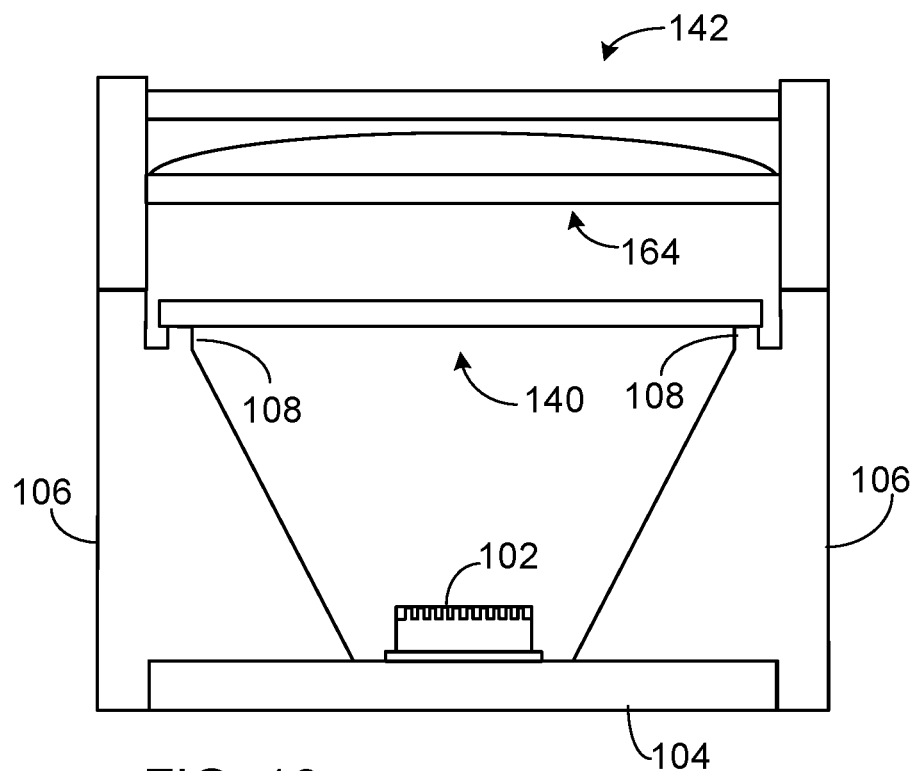
FIG. 16 illustrates an example of a module including an auto-focus assembly.

To alleviate dimensional changes caused by thermal expansion even further, some implementations include an auto-focus mechanism 164 (see FIG. 16). The auto-focus mechanism 164 can be implemented, for example, as a tunable lens or a piezo-electric element. The auto-focus mechanism can be used alone or in conjunction with a glass optical element and/or the customizable vertical alignment features to provide very accurate and precise optical performance for the light emitter module. Other features described in the various implementations described above also can be combined in the same module.

Various electrical connections can be provided to or from the light emitter 102. Such electrical connections may include, for example, conductive vias through the housing 106 and/or connections in the form of an electrically conductive coating on the interior or exterior surface of the housing 106. The wiring can provide electrical connections, for example, between the emitter 102 and the substrate 104. Electrical pads or other connections on the backside of the substrate 104 can facilitate connections to other devices or modules, which may be mounted, for example, together with the light emitter module on a printed circuit board.

In some implementations, the module can include an optical element having a mask (e.g., a black chrome mask on the transparent substrate 110). An example of such am implementation is described in detail below.

Figure 17:
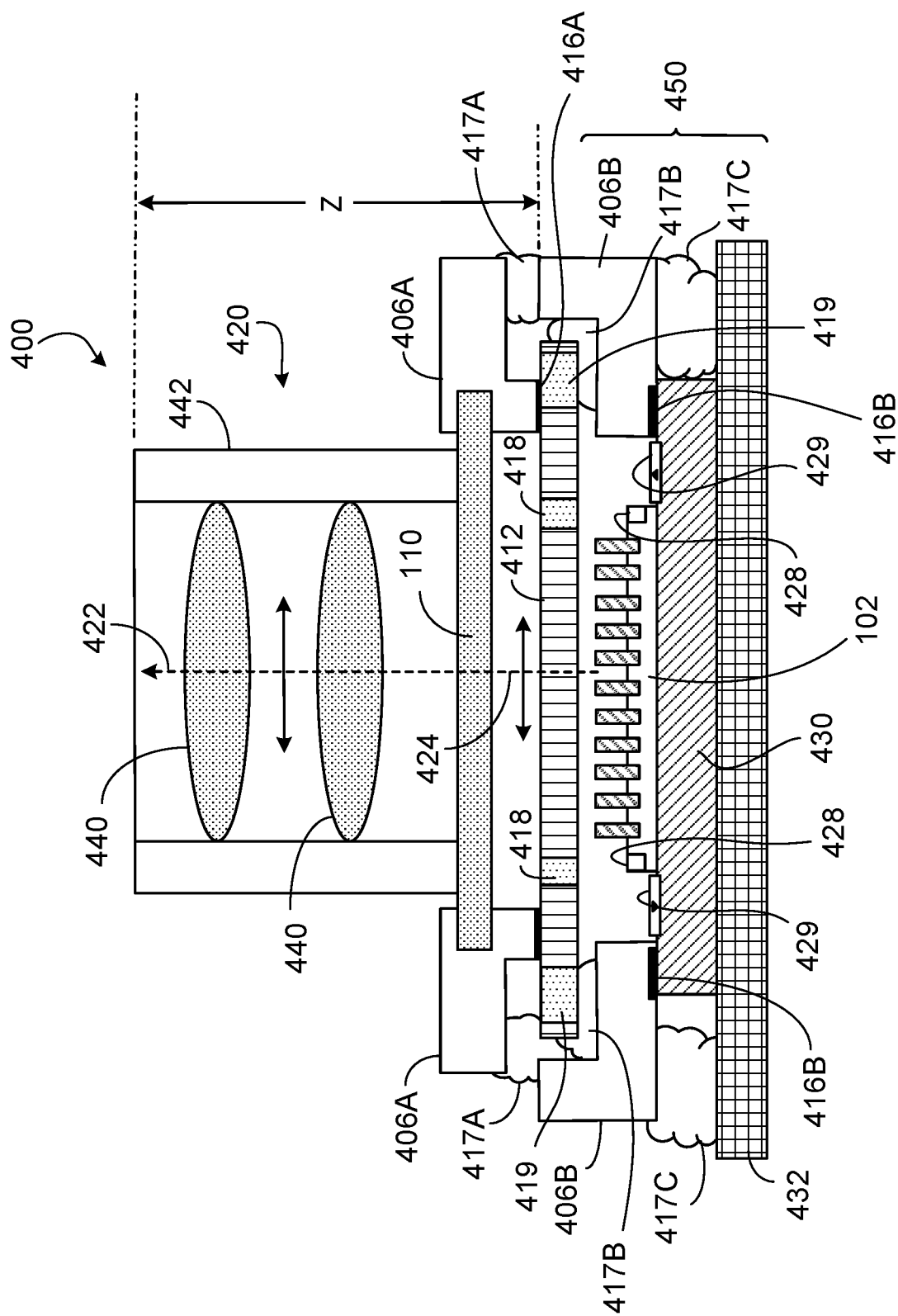
FIG. 17 illustrates an example of an illumination projector.

FIG. 17 illustrates another example of an illumination projector 400. To generate a high-quality light projection/illumination, precise alignment preferably should be provided as follows: (1) the focal length of the optical assembly 420 should fall on the plane of the mask 412, and (2) the (central) optical axis 422 of the assembly 420 should coincide with the (central) optical axis 424 of the emitter (e.g., VCSEL 102). As discussed above, the thickness of adhesive layers cannot be controlled precisely. Accordingly, the optical assembly 420 is provided with a first spacer 406A having vertical alignment features 416A that allow a height Z (i.e., a distance between the mask 412 and the optical assembly) to be precisely defined via a direct mechanical connection. Further, the optical assembly 420 can be fixed in place via adhesive 417A applied between the first spacer 406A and a second spacer 406B that forms part of the housing for the light emitting element (e.g., VCSEL 102). The first spacer 406A can be formed separately from the lens barrel 442 of the optical assembly 420, as in the example of FIG. 17, or can be formed as a single integral piece with the lens barrel 442, as in the example of FIG. 19.

One challenge in aligning the optical axis 422 of the assembly 420 with the optical axis 424 of the VCSEL 102 is that during assembly, the optical element including the mask 412 is attached to the VCSEL assembly, whereas the optical assembly 420 subsequently is attached to the VCSEL/mask assembly. Thus, a problem can arise because the VCSEL 102 cannot be seen through the mask 412 for purposes of alignment. To alleviate this issue, transparent alignment windows 418 can be incorporated into the optical element that includes the mask 412 so that alignment marks 428 on the VCSEL 102 can be seen when the optical assembly 420 is attached to the VCSEL assembly 450. The optical assembly 20 can thus be aligned precisely to the VCSEL 102.

Figure 18A:
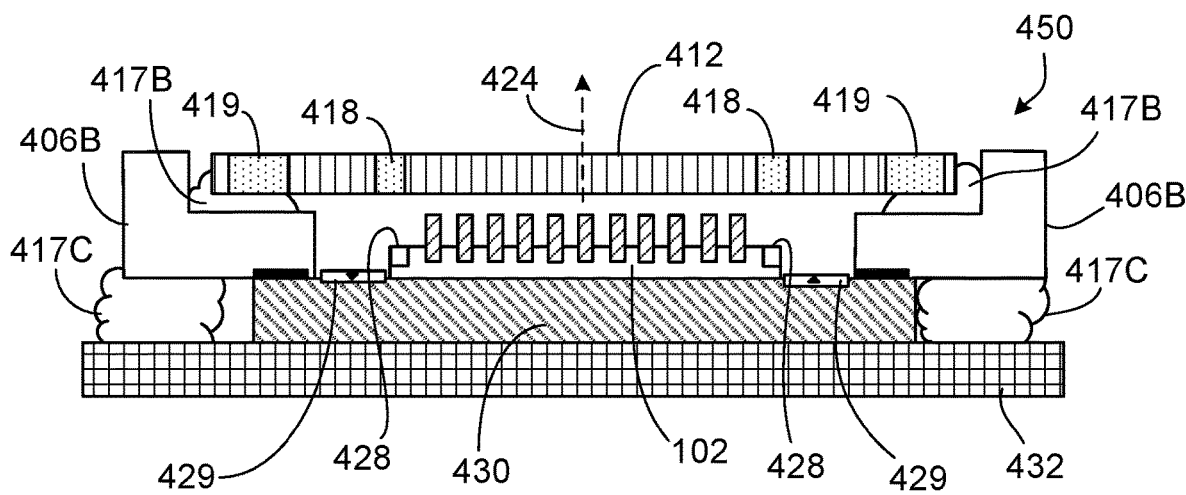
FIGS. 18A, 18B, 18C illustrate an example of assembling the illumination projector of FIG. 17.
Figure 18B:
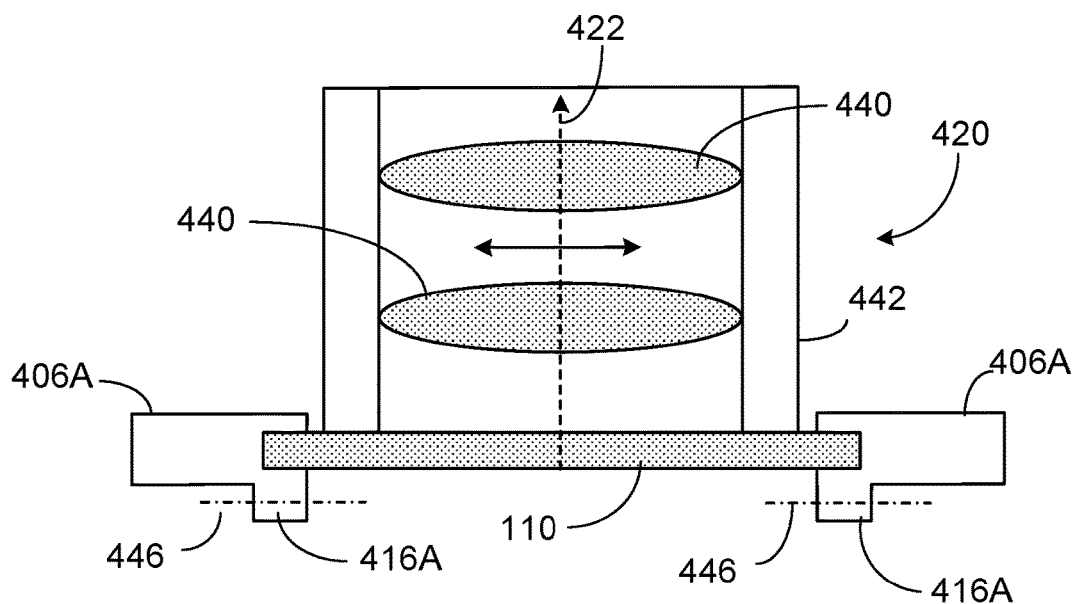
Figure 18C:
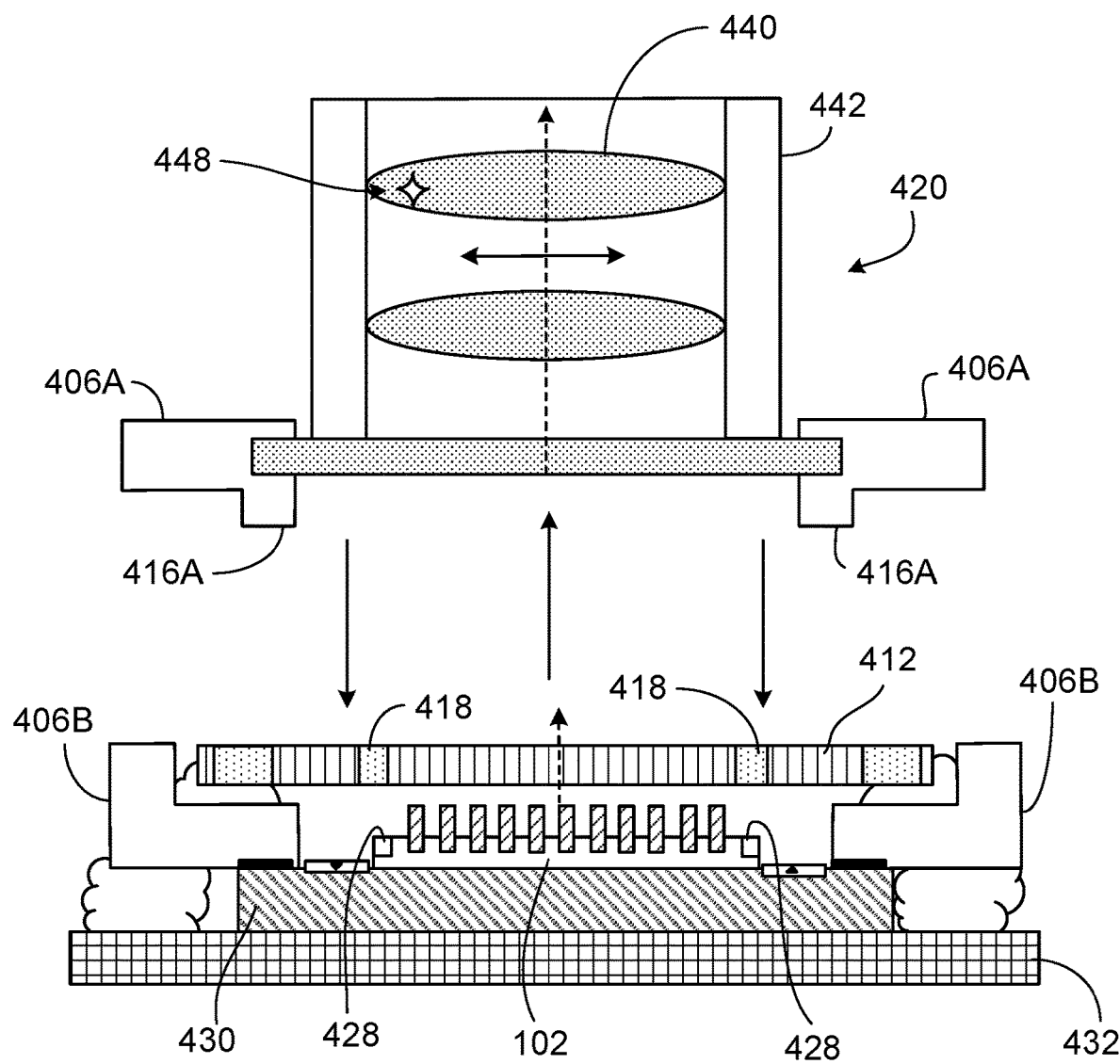

FIGS. 18A, 18B, 18C illustrate an example process for assembling the module 400. The VCSEL 102 is mounted on a sub-mount assembly, which can include, for example, a metal (e.g., copper) trace 430 on a sub-mount 432. To facilitate horizontal alignment of the VCSEL 102 on the metal trace 430, alignment features 429 can be provided on the VCSEL-side surface of the metal trace 430.

As further shown in FIG. 18A surface 416B of the second spacer 406B abuts (i.e., is in direct mechanical contact with) the VCSEL-side surface of the metal trace 430. If desired, the surface 416B can be machined beforehand so as to provide more precise vertical alignment. The spacer 406B thus includes vertical alignment features (i.e., surface 416B). The spacer 406B also can be fixed to the sub-mount 432 by adhesive 417C. Advantageously, in the illustrated example, the adhesive 417C is not in close proximity to the VCSEL 102. Further, direct mechanical contact between the spacer 406B and the metal trace 430 can result in better height accuracy as there is no intervening layer of variable height/thickness.

As further shown in FIG. 18A, the second spacer 406B, which laterally surrounds the VCSEL 102, separates the mask 412 from the VCSEL/sub-mount assembly. The optical element that includes the mask 412 can be fixed to the second spacer 406B by adhesive 417B, which can be cured, for example, by UV radiation. UV-transparent windows 419 in the mask 412 permit the adhesive 417B to be cured using UV radiation. FIG. 18A shows the resulting VCSEL assembly 450.

Figure 19:
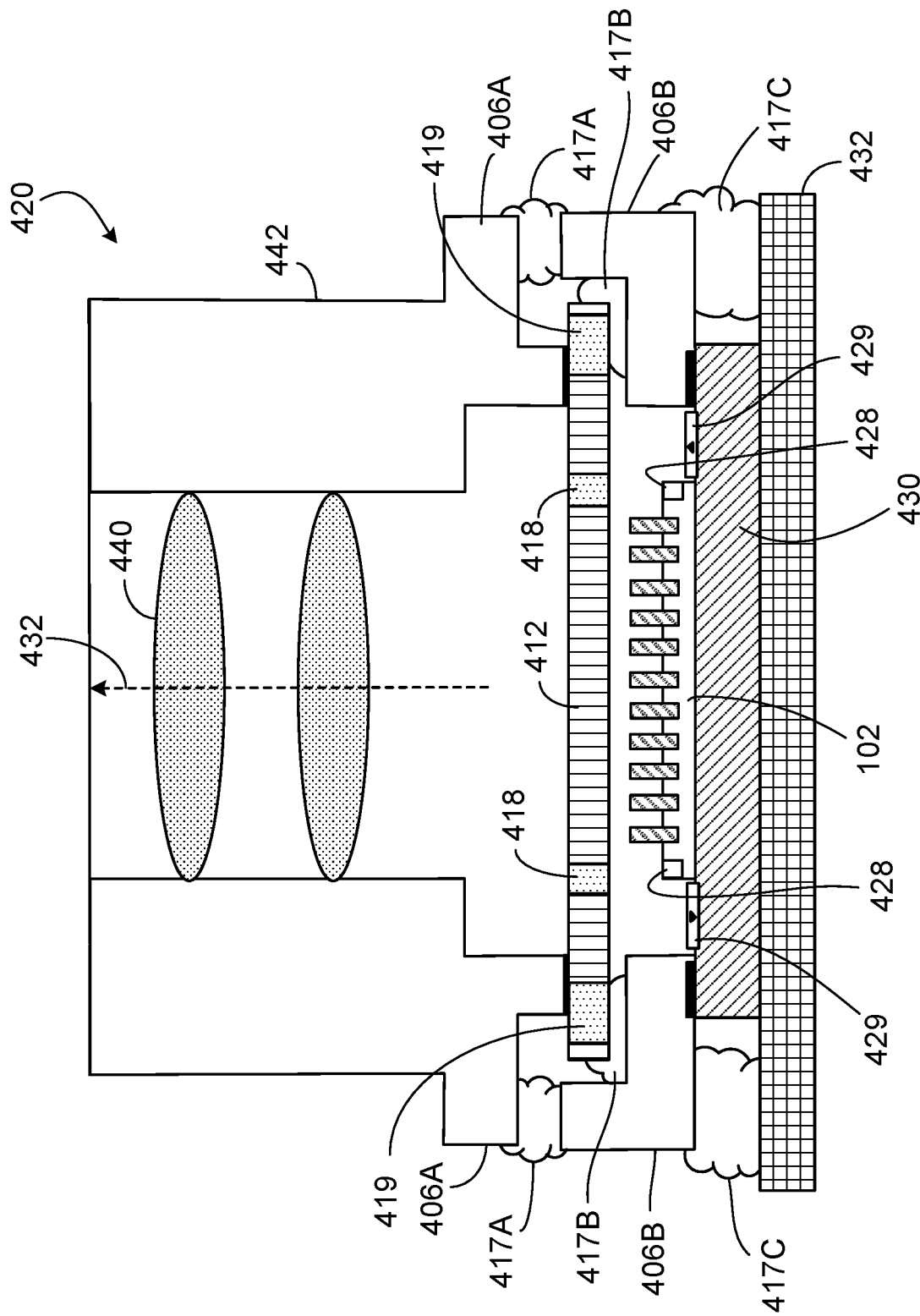
FIG. 19 illustrates another implementation of an illumination projector.

As shown in FIG. 18B, the optical assembly 420 can include one or more optical elements (e.g., lenses) 440 held by a barrel 442 over a transparent cover 110. In the illustrated example, the first spacer 406A laterally surrounds the transparent cover 110. In other cases, as shown in FIG. 19, the first spacer 406A can be formed integrally as a single piece with the barrel 442. In such cases, the transparent cover 110 may be omitted.

The distance between the optical assembly 420 and the mask 412 should be controlled carefully so that the focal length of the optical assembly 420 coincides with the plane of the mask 412. Thus, in some cases, the height of the spacer 406A can be customized, for example, by machining, as indicated by the horizontal dashed lines 446 in FIG. 18B. Machining also can be used, if needed, to correct for tilt. In some cases, the spacer 406A can be manufactured to sufficient accuracy such that that further dimensional customization is unnecessary. The first spacer 406A thus includes vertical alignment features (i.e., the surface 416A).

Next, the optical assembly 420 is attached to the VCSEL assembly 450. The position of the (central) optical axis 422 of the optical assembly 420 is determined. Also, the position of the (central) optical axis 424 of the VCSEL 102 is determined using, for example, the alignment windows 418 and the alignment marks 428 on the surface of the VCSEL 102. The optical assembly 420 also may include one or more alignment marks, for example, one or more alignment marks 448 on the lenses 440. The two assemblies 420, 450 then are fixed to one another (see FIG. 18C), for example, with an adhesive 417A such as epoxy (see FIG. 18A). In particular, the first and second spacers 406A, 406B can be fixed to another via epoxy 417A. The vertical alignment features of the spacer 406A (i.e., surface 416A) abuts (i.e., is in direct mechanical contact with) the optical assembly-side surface of the mask 412 so as to precisely define the height Z (FIG.

17) and so as to precisely fix the distance between the optical assembly 420 and the mask 412.

Although the foregoing examples are described in the context of modules that include a light emitter, in some implementations the module may include a different type of active optoelectronic device such as a light detector. For example, instead of the device 102 being a light emitter, it may be an image sensor that includes an array of light sensitive elements (i.e., pixels). In the context of modules that include a light detector, the various features described above can be advantageous, for example, in establishing a proper z-height such that the focal-length of a lens is on the image sensor. Other features (e.g., providing opaque encapsulant 116 surrounding the side edges of the transparent cover 110) may be useful in preventing stray light from impinging on the image sensor.

Terms such as "transparent," "non-transparent" and "opaque" are used in this disclosure with reference to the wavelength(s) of light emitted or detectable by the optoelectronic device. Thus, in the context of the present disclosure, a material or component that is non-transparent or opaque may allow light of other wavelengths to pass through with little or no attenuation. Likewise, a material or component that is transparent to light emitted or detectable by the optoelectronic device may not allow light of other wavelengths to pass or may significantly attenuate light of such other wavelengths.

The modules described here may be integrated into a wide range of consumer products and/or other electronic devices, such as bio devices, mobile robots, surveillance cameras, camcorders, laptop computers, tablet computers, and desktop computers, among others.

Other implementations are within the scope of the claims.

What is claimed is:

1. A method of fabricating a light emitter or light detector module, the method comprising:
   providing a housing laterally surrounding an optoelectronic device mounted on a substrate, wherein the housing laterally surrounds the optoelectronic device in a same plane in which the optoelectronic device is disposed, the optoelectronic device operable to emit light or detect light; and
   fixing a first optical element in place over the optoelectronic device using an adhesive, the optical element being substantially transparent to light emitted or detectable by the optoelectronic device, wherein one or more vertical alignment features separate the optical element from a surface of the housing, and wherein the adhesive is not provided at any interface between the one or more vertical alignment features and the housing with respect to a vertical direction; and
   the method further including performance of the following steps subsequent to providing the housing laterally surrounding the optoelectronic device mounted on the substrate and prior to fixing the optical element in place over the optoelectronic device:
   making one or more measurements indicative of a height in a direction of an optical axis of the module;
   machining at least one surface by an amount based on the one or more measurements to achieve a specified distance between the optoelectronic device and the optical element;
   wherein the at least one machined surface includes at least one of:
   a contact surface of a particular vertical alignment feature, or
   an opposing contact surface, which is brought into direct contact with the contact surface of the particular vertical alignment feature when the optical element is fixed in place over the optoelectronic device and
   providing one or more extensions projecting from a surface of the optical element in a direction toward, but not reaching, a surface of the housing, each extension being attached to a surface of the housing by adhesive,
   wherein a height of the one or more vertical alignment features is greater than a height of the one or more extensions in the vertical direction, and
   wherein a channel is defined between at least one of the one or more vertical alignment features and at least one of the one or more extensions and extending to the adhesive.

2. The method of claim 1 wherein the one or more vertical alignment features are provided on a surface of the optical element, and wherein a contact surface of at least one of the vertical alignment features is machined, by an amount based on the one or more measurements, prior to fixing the optical element in place over the optoelectronic device to achieve the specified distance between the optoelectronic device and the optical element.

3. The method of claim 1 wherein the one or more vertical alignment features are provided as extensions from a surface of the housing, and wherein a contact surface of at least one of the vertical alignment features is machined, by an amount based on the one or more measurements, prior to fixing the optical element in place over the optoelectronic device to achieve the specified distance between the optoelectronic device and the optical element.

4. The method of claim 1 including machining the opposing contact surface, by an amount based on the one or more measurements, prior to fixing the optical element in place over the optoelectronic device.

5. The method of claim 1 including providing adhesive such that side edges of the optical element are attached to an inner-facing surface of the housing by the adhesive.

6. The method of claim 1 including providing adhesive such that a first extension projecting from a side of the optical element closer to the optoelectronic device is attached to a second extension projecting from a surface of the housing, wherein the first and second extensions are different from the one or more vertical alignment features.

7. The method of claim 1 further including fixing a second optical element in place over the first optical element using an adhesive, the second optical element being substantially transparent to light emitted or detectable by the optoelectronic device, wherein one or more second vertical alignment features separate the second optical element from the first optical element, and wherein the adhesive is not provided at any interface with the one or more second vertical alignment features;
   the method further including performance of the following steps prior to fixing the second optical element in place over the first optical element:
   machining at least one surface to achieve a specified distance between the optoelectronic device and the second optical element,
   wherein the at least one machined surface includes at least one of:
   a contact surface of a particular second vertical alignment feature, or
   an opposing second contact surface, which is in direct contact with the contact surface of the particular second vertical alignment feature when the second optical element is fixed in place over the first optical element.

8. The method of claim 7 wherein the one or more second vertical alignment features are provided on a surface of the second optical element, and wherein a contact surface of at least one of the second vertical alignment features is machined prior to fixing the second optical element in place to achieve the specified distance between the optoelectronic device and the second optical element.

9. The method of claim 8 including, prior to fixing the second optical element in place over the first optical element, machining the opposing second contact surface.

10. A light emitter or light detector module comprising:
an optoelectronic device mounted on a substrate, the optoelectronic device being operable to emit light or detect light;
a housing laterally surrounding the optoelectronic device and serving as sidewalls for the module, wherein the housing laterally surrounds the optoelectronic device in a same plane in which the optoelectronic device is disposed;
an optical element over the optoelectronic device, wherein the optical element is substantially transparent to light emitted or detectable by the optoelectronic device;
one or more vertical alignment features separating the optical element from the housing, wherein the optical element is in direct contact with the one or more vertical alignment features, wherein there is an absence of adhesive between the one or more vertical alignment features and the housing with respect to a vertical direction; and
one or more extensions projecting from a surface of the optical element in a direction toward, but not reaching, a surface of the housing, each extension being attached to a surface of the housing by adhesive,
wherein a height of the one or more vertical alignment features is greater than a height of the one or more extensions in the vertical direction, and
wherein a channel is defined between at least one of the one or more vertical alignment features and at least one of the one or more extensions and extending to the adhesive.

11. The module of claim 10 wherein the one or more vertical alignment features are composed of a same material as the housing.

12. The module of claim 10 wherein the one or more vertical alignment features are formed as a unitary piece with the housing.

13. The module of claim 10 wherein side edges of the optical element are attached to an inner-facing surface of the housing by adhesive.

14. The module of claim 10 wherein the module includes non-transparent sidewalls that laterally surround the optical element.

15. The module of claim 10 wherein side edges of the optical element are laterally encapsulated in a non-transparent material.

16. The module of claim 10 wherein the extension is formed as a unitary piece with, and composed of a same material as, at least one of the one or more vertical alignment features.

17. The module of claim 16 wherein side edges of the optical element are laterally encapsulated in a non-transparent material that is formed as a unitary piece with, and composed of the same material as, the extension.

18. The module of claim 10 including one or more second vertical alignment features, each of which projects from the housing and each of which is aligned with, and in direct contact with, a corresponding one of the vertical alignment features that projects from the optical element.

19. The module of claim 18 including:
at least one second extension projecting from the housing in a direction toward the optical element, wherein each second extension is attached, by adhesive, to a corresponding one of the extensions projecting from the optical element.

20. The module of claim 19 wherein each second vertical alignment feature and each second extension is formed as a unitary piece with, and is composed of a same material as, the housing.

21. The module of claim 20 wherein each vertical alignment feature projecting from the optical element is formed as a unitary piece with, and is composed of a same material as, a corresponding one of the extensions projecting from the optical element.

22. The module of claim 18 wherein the optical element is laterally encapsulated in a non-transparent material.

23. The module of claim 10 wherein the optical element is part of a first optical assembly disposed over the optoelectronic device.

24. The module of claim 23 further including a second optical element disposed over the first optical assembly, the second optical element being substantially transparent to light emitted or detectable by the optoelectronic device.

25. The module of claim 24 wherein the second optical element is separated from the optical element of the first optical assembly by one or more vertical alignment features that are in direct contact with the optical element of the first optical assembly and the second optical element.

26. The module of claim 10 wherein the housing includes a first inner ledge and a second inner ledge, wherein the vertical alignment features are disposed between the first inner ledge and the optical element and are in direct contact with the first inner ledge and the optical element,
the module further including:
a second optical element over the optoelectronic device, the second optical element being substantially transparent to light emitted or detectable by the optoelectronic device; and
one or more second vertical alignment features disposed between the second inner ledge and the second optical element and are in direct contact with the second inner ledge and the second optical element.

27. The module of claim 26 wherein the second inner ledge has a larger circumference than the first inner ledge and is located further from the optoelectronic device than the first inner ledge.

28. The module of claim 26 wherein side edges of both optical elements are attached to respective inner-facing surfaces of the housing by adhesive.

29. The module of claim 10 including one or more lateral alignment features having a side surface that abuts a side surface of a corresponding one of the vertical alignment features projecting from the optical element, wherein each lateral alignment feature projects from the housing and is formed as a unitary piece with, and is composed of a same material as, the housing.

30. The module of claim 10 wherein the substrate is composed of a copper alloy.

31. The module of claim 10 wherein the housing is composed of an injection molded epoxy with a ceramic filler or injection molded metal.

32. The module of claim 10 wherein the optoelectronic device comprises a vertical cavity surface emitting laser or a laser diode.

33. The module of claim 10 wherein the optoelectronic device comprises an image sensor.

34. The module of claim 10 wherein the optical element is composed of glass.

35. The module of claim 10 further including an auto-focus mechanism.

* * * * *